United States Patent
Thompson et al.

(10) Patent No.: US 11,740,677 B2
(45) Date of Patent: Aug. 29, 2023

(54) SYSTEM AND METHOD OF ESTIMATING TIME REMAINING FOR AN INFORMATION HANDLING SYSTEM TO OPERATE ON ELECTRICAL POWER PROVIDED BY ONE OR MORE BATTERIES

(71) Applicant: Dell Products L.P., Round Rock, TX (US)

(72) Inventors: Richard Christopher Thompson, Cedar Park, TX (US); Nikhil Manohar Vichare, Austin, TX (US); Michael Raymond Nechay, Austin, TX (US); Tyler Ryan Cox, Austin, TX (US); Thanh Thien Tran, Houston, TX (US)

(73) Assignee: Dell Products L.P., Round Rock, TX (US)

( * ) Notice: Subject to any disclaimer, the term of this patent is extended or adjusted under 35 U.S.C. 154(b) by 526 days.

(21) Appl. No.: 17/028,273

(22) Filed: Sep. 22, 2020

(65) Prior Publication Data

US 2022/0091655 A1  Mar. 24, 2022

(51) Int. Cl.
*G06F 1/3212* (2019.01)
*G01R 31/371* (2019.01)
(Continued)

(52) U.S. Cl.
CPC ......... *G06F 1/3212* (2013.01); *G01R 31/367* (2019.01); *G01R 31/371* (2019.01); *G06F 1/28* (2013.01)

(58) Field of Classification Search
CPC . G06F 1/3212; G06F 1/28; G06F 1/30; G06F 1/26; G01R 31/367; G01R 31/371; G01R 31/382; Y02D 10/00
See application file for complete search history.

(56) References Cited

U.S. PATENT DOCUMENTS

| 11,340,678 B2 * | 5/2022 | Thompson | G06F 1/263 |
| 2013/0085696 A1 * | 4/2013 | Xu | G06F 17/40 |
| | | | 702/63 |

(Continued)

*Primary Examiner* — Stacy Whitmore
(74) *Attorney, Agent, or Firm* — McDermott Will & Emery LLP

(57) ABSTRACT

In one or more embodiments, one or more systems, one or more methods, and/or one or more processes may determine a historical discharge rate ($d_h$) from multiple discharge rates a battery of an information handling system (IHS) while the IHS operates on electrical power provided by the battery; receive a current discharge rate ($d_c$) of the battery; determine a full charge capacity correction factor value ($C_{fcc}$) associated with the battery; determine a weighting factor ($\alpha$); determine a difference between a full charge capacity value (FCC) and $C_{fcc}$; determine $\alpha \cdot d_h$; determine $(1-\alpha) \cdot d_c$; determine a sum of $d_h \cdot \alpha$ and $d_c \cdot \alpha$; determine a quotient value of FCC$-C_{fcc}$ and $\alpha \cdot d_h + (1-\alpha) \cdot d_c$; scale the quotient value based at least on a relative state of charge of the battery to determine an estimated time remaining for the IHS to operate on the electrical power provided by the battery; and display the estimated time remaining.

20 Claims, 12 Drawing Sheets

(51) Int. Cl.
*G01R 31/367* (2019.01)
*G06F 1/28* (2006.01)

(56) References Cited

U.S. PATENT DOCUMENTS

| | | | |
|---|---|---|---|
| 2015/0276881 A1* | 10/2015 | Liu | G01R 31/382 |
| | | | 324/426 |
| 2021/0271303 A1* | 9/2021 | Vichare | G06F 1/28 |
| 2022/0091650 A1* | 3/2022 | Thompson | G06F 1/28 |

* cited by examiner $$Estimated\ Runtime = \frac{FCC - C_{fcc}}{\alpha(d_h) + (1-\alpha)(d_c)} \cdot \left(\frac{R_{SOC}}{100\%}\right)$$

Equation 550

*Temperature*

| Charge Rate | <15 °C | 16-30 °C | 31-45 °C | 46-50 °C |
|---|---|---|---|---|
| > 0.5 | 0 | 2 | 4 | 6 |
| 0.2-0.5 | 8 | 10 | 12 | 14 |
| 0.125-0.2 | 16 | 18 | 20 | 22 |
| 0.08-0.125 | 24 | 26 | 28 | 30 |
| 0.05-0.08 | 32 | 34 | 36 | 38 |
| <0.05 | 40 | 44 | 48 | 52 |

SYSTEM AND METHOD OF ESTIMATING TIME REMAINING FOR AN INFORMATION HANDLING SYSTEM TO OPERATE ON ELECTRICAL POWER PROVIDED BY ONE OR MORE BATTERIES

BACKGROUND

Field of the Disclosure

This disclosure relates generally to information handling systems and more particularly to estimating time remaining for an information handling system to operate on electrical power provided by one or more batteries.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, one or more methods, and/or one or more processes may determine multiple discharge rates of a battery of an information handling system while the information handling system operates on electrical power provided by the battery; may determine a historical discharge rate from the multiple discharge rates; may receive a current discharge rate of the battery from an embedded controller of the information handling system; may receive the historical discharge rate from the embedded controller; may determine a full charge capacity correction factor value associated with the battery; may determine a weighting factor associated with the historical discharge rate and the current discharge rate; may determine a difference between a full charge capacity value associated with the battery and the full charge capacity correction factor value; may modify the historical discharge rate based at least on the weighting factor to determine a modified historical discharge rate; may modify the current discharge rate based at least on the weighting factor to determine a modified current discharge rate; may determine a sum of the modified historical discharge rate and the modified current discharge rate; may determine a first quotient value of the difference between the full charge capacity value and the full charge capacity correction factor value and the sum of the modified historical discharge rate and the modified current discharge rate; may scale the first quotient value based at least on a relative state of charge of the battery to determine an estimated time remaining for the information handling system to operate on the electrical power provided by the battery; and may display, via a display, the estimated time remaining for the information handling system to operate on the electrical power provided by the battery.

In one or more embodiments, the one or more systems, the one or more methods, and/or the one or more processes may further determine an actual time that remained while the information handling system operated on the electrical power provided by the battery; determine an error between the actual time that remained and the estimated time remaining; and adjust the weighting factor based at least on the error between the actual time that remained and the estimated time remaining.

In one or more embodiments, the one or more systems, the one or more methods, and/or the one or more processes may further determine an identification of an application being executed by at least one processor of the information handling system and adjust the weighting factor based at least on the identification of the application. In one or more embodiments, determining the historical discharge rate from the multiple discharge rates may include determining a mean discharge rate from the multiple discharge rates as the historical discharge rate. In one or more embodiments, determining the historical discharge rate from the multiple discharge rates may include determining a mean discharge rate from the multiple discharge rates as the historical discharge rate. In one or more embodiments, the one or more systems, the one or more methods, and/or the one or more processes may further receive an analog voltage signal from a battery charger of the information handling system and determine the current discharge rate based at least on the analog voltage signal from the battery charger.

In one or more embodiments, the one or more systems, the one or more methods, and/or the one or more processes may further determine a second quotient of the relative state of charge and one hundred percent. In one example, scaling the first quotient value based at least on the relative state of charge may include multiplying the first quotient and the second quotient to determine the estimated time remaining for the information handling system to operate on the electrical power provided by the battery. In another example, scaling the first quotient value based at least on the relative state of charge may include multiplying the first quotient and the second quotient to determine the estimated time remaining for the information handling system to operate on the electrical power provided by the battery.

In one or more embodiments, the weighting factor may range from zero to one. In one example, modifying the historical discharge rate based at least on the weighting factor to determine the modified historical discharge rate may include multiplying the historical discharge rate by the weighting factor. In another example, modifying the current discharge rate based at least on the weighting factor to determine the modified current discharge rate may include multiplying the current discharge rate by a difference between one and the weighting factor.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1A:
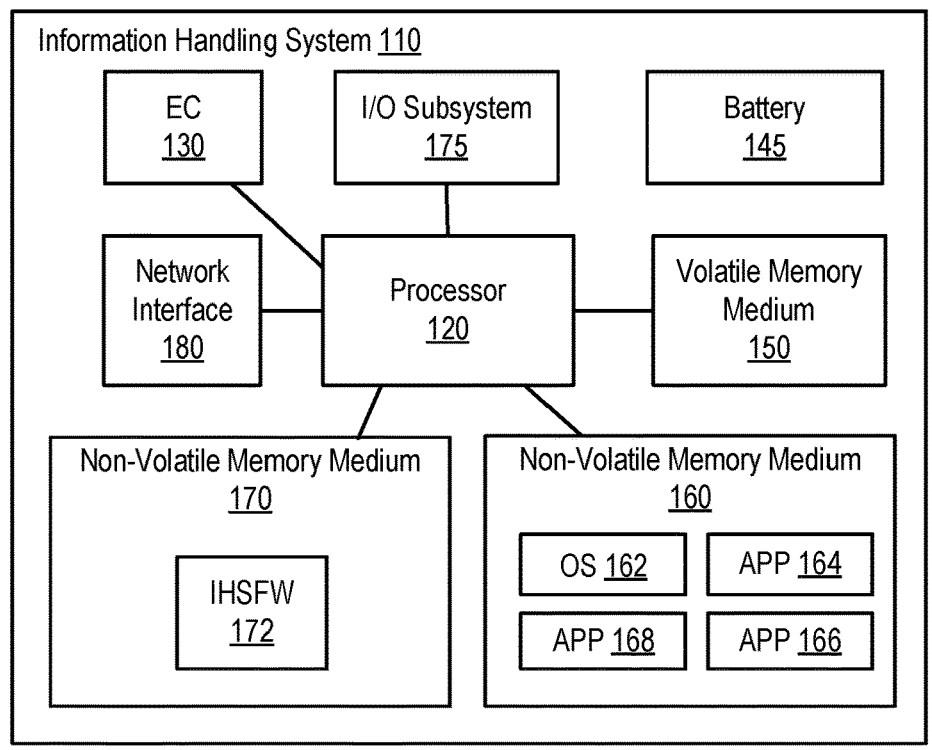
FIG. 1A illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, an information handling system may operate utilizing power drawn from one or more rechargeable batteries. For example, a user of an information handling system may typically alternate between recharging the one or more rechargeable batteries while the information handling system is coupled to an external power source and operating the information handling system via power drawn from the external power source during a discharge cycle of the one or more batteries. Frequency and depth of the discharge cycles and/or the charge cycles may vary. Further, a user may utilize multiple different information handling systems and/or may utilize varying patterns of discharge cycles and/or charge cycles for each of the information handling systems.

In one or more embodiments, an information handling system may be consistently coupled to an external power source. For example, a battery of the information handling system may be fully charged or mostly charged with occasional operation from battery power. For instance, an occasional discharge cycle may result in a small portion of the available battery capacity being utilized. In one or more embodiments, utilization of an information handling system may discharge the battery of the information handling system regularly. For example, each of these discharge cycles may utilize all or nearly all of the available battery capacity.

In one or more embodiments, while operating from battery power, reports of remaining available battery capacity may be generated and/or displayed to a user. One or more systems that may report remaining available capacity of a rechargeable battery may base these capacity determinations at least on a determined full charge capacity (FCC) of the battery. Since a charge capacity of a rechargeable battery may degrade during a lifespan of a battery, a determined full charge capacity of a battery may not reflect the degradation of the battery between measurements of the full charge capacity. Estimates may be generated for the battery capacity during intervals between these measurements, but inaccurate estimates may result in unused battery capacity, unnecessary loss of use of the information handling system and/or battery failure, among others.

In one or more embodiments, a battery status indicator may display estimated remaining time of a battery of an information handling system. For example, the estimated remaining time of the battery may be determined based at least on a one minute running average time and/or based at least on electrical current or electrical power being discharged from the battery. Determining the estimated remaining time of the battery in this fashion may not always accurate because of random activities that may cause power spikes, which may lead to variations of information handling system power consumption.

In one or more embodiments, discharge rates of the battery may be monitored and/or recorded over a period of time. Data associated with the discharge rates may be available to a battery management unit (BMU). The data associated with the discharge rates may be available to an operating system and/or an application executing on the information handling system. In one or more embodiments, a discharge rate distribution may be determined for each user and battery combination. For example, a weighted average discharge rate may be utilized. In one or more embodiments, an estimate of an electrical current discharge rate from the battery may be determined via an adaptive moving average.

In one or more embodiments, the battery may update a FCC after a calibration cycle. For example, a calibration cycle may occur when the battery drops below eight percent (8%) relative state of charge (RSOC). In one or more embodiments, a RSOC may include values of zero percent (0%) to one hundred percent (100%). In one or more embodiments, RSOC may be different from an absolute state of charge (ASOC). For example, the ASOC may be associated with design parameters of the battery, while the RSOC may be associated with a state of the battery. For instance, the state of the battery may be associated with one or more of a number of times that the battery has been discharged and charged, an age of the battery, what temperature conditions the battery has been exposed, how fast has the battery been charged, and how fast has the battery been discharged, among others. As an example, depending on utilization of the battery, the battery may have an ASOC of ninety percent (90%) while the battery may have a RSOC of one hundred percent (100%). For instance, the battery may be charged to one hundred percent (100%) of a charge capacity that it can store while the battery may only be charged to ninety percent (90%) of what it could have stored when the battery was new.

In one or more embodiments, the estimated remaining time of the battery may be based at least on a processing load of the information handling system. In one example, the processing load of the information handling system may include displaying a video to a user. In another example, the processing load of the information handling system may include rendering a video. For instance, rendering a video may be associated with a higher processing load than displaying a video to a user. In one or more embodiments, a discharge rate of the battery may be associated with a processing load of the information handling system. For example, multiple discharge rates associated with a processing load. For instance, based at least on a processing load, a discharge rate may be determined. As an example, a processing load may be determined, and a discharge rate may be determined from stored discharge rate data (e.g., historical discharge rate data).

Turning now to FIG. 1A, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a volatile memory medium 150, non-volatile memory media 160 and 170, an I/O subsystem 175, and a network interface 180. As illustrated, volatile memory medium 150, non-volatile memory media 160 and 170, I/O subsystem 175, and network interface 180 may be communicatively coupled to processor 120.

In one or more embodiments, one or more of volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of volatile memory medium 150, non-volatile memory media 160 and 170, I/O subsystem 175, and network interface 180 may be communicatively coupled to processor 120 via one or more PCI-Express (PCIe) root complexes. In another example, one or more of I/O subsystem 175 and a network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, at least a portion of one or more flowcharts, at least a portion of one or more methods, and/or at least a portion of one or more processes described herein.

In one example, processor 120 may execute processor instructions from one or more of memory media 150, 160, and 170 in implementing at least a portion of one or more systems, at least a portion of one or more flowcharts, at least a portion of one or more methods, and/or at least a portion of one or more processes described herein. In another example, processor 120 may execute processor instructions via network interface 180 in implementing at least a portion of one or more systems, at least a portion of one or more flowcharts, at least a portion of one or more methods, and/or at least a portion of one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150, 160, and 170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, OS 162 may include a management information exchange. In one example, the management information exchange may permit multiple components to exchange management information associated with managed elements and/or may permit control and/or management of the managed elements. In another example, the management information exchange may include a driver and/or a driver model that may provide an OS interface through which managed elements (e.g., elements of IHS 110) may provide information and/or notifications, among others. In one instance, the management information exchange may be or include a Windows Management Interface (WMI) for ACPI (available from Microsoft Corporation). In another instance, the management information exchange may be or include a Common Information Model (CIM) (available via the Distributed Management Task Force). In one or more embodiments, the management information exchange may include a combination of the WMI and the CIM. For example, WMI may be and/or may be utilized as an interface to the CIM. For instance, the WMI may be utilized to provide and/or send CIM object information to OS 162.

As illustrated, IHS 110 may include a battery 145. In one or more embodiments, battery 145 may provide power to one or more components of IHS 110. For example, the one or more components of IHS 110 may include one or more of processor 120, EC 130, volatile memory medium 150, non-volatile memory medium 160, non-volatile memory medium 170, and network interface 180, among others. In one or more embodiments, battery 145 may be a rechargeable battery. Although IHS 110 is illustrated as including a single battery 145, IHS 110 may include any number of batteries 145, according to one or more embodiments. In one or more embodiments, processor 120 and one or more components of IHS 110 may be included in a system-on-chip (SoC). For example, the SoC may include processor 120 and a platform controller hub (not specifically illustrated).

In one or more embodiments, EC 130 may be or include a remote access controller. For example, the remote access controller may be or include a DELL™ Remote Access Controller (DRAC). In one or more embodiments, a remote access controller may be integrated into IHS 110. For example, the remote access controller may be or include an integrated DELL™ Remote Access Controller (iDRAC). In one or more embodiments, a remote access controller may include one or more of a processor, a memory, and a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. In one example, the remote access controller may be based at least on an Intelligent Platform Management Interface (IPMI) standard. For instance, the remote access controller may allow and/or permit utilization of IPMI out-of-band interfaces such as IPMI Over LAN (local area network). In another example, the remote access controller may be based at least on a Redfish standard. In one instance, one or more portions of the remote access controller may be compliant with one or more portions of a Redfish standard. In another instance, one or more portions of the remote access controller may implement one or more portions of a Redfish standard. In one or more embodiments, a remote access controller may include and/or provide one or more internal private networks. For example, the remote access controller may include and/or provide one or more of an Ethernet interface, a front panel USB interface, and a Wi-Fi interface, among others. In one or more embodiments, a remote access controller may be, include, or form at least a portion of a virtual KVM (keyboard, video, and mouse) device. For example, a remote access controller may be, include, or form at least a portion of a KVM over IP (IPKVM) device. For instance, a remote access controller may capture video, keyboard, and/or mouse signals; may convert the signals into packets; and may provide the packets to a remote console application via a network.

In one or more embodiments, EC 130 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, EC 130 may be or include an application processor. In one example, EC 130 may be or include an ARM Cortex-A processor. In another example, EC 130 may be or include an Intel Atom processor. In one or more embodiments, EC 130 may be or include one or more of a field programmable gate array (FPGA) and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

In one or more embodiments, EC 130 may generate estimates of a full charge capacity of battery 145 based at least on battery operation parameters received from battery 145. EC 130 may provide such battery capacity determinations to operating system functions of IHS 110 for reporting to a user of IHS 110. In one or more embodiments, battery capacity information generated by EC 130 may be provided to IHSFW 172 for reporting to hardware one or more components of IHS 110 and/or in support of power operations supported by IHSFW 172.

Figure 1B:
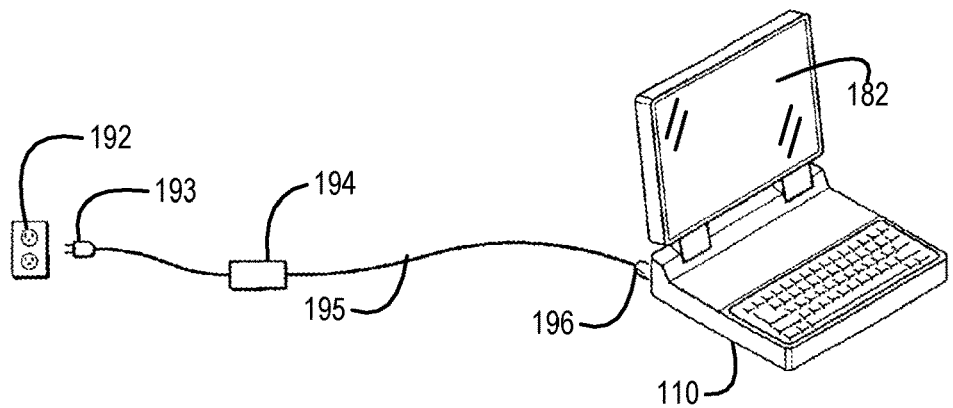
FIG. 1B illustrates a second example of an information handling system, according to one or more embodiments.

Turning now to FIG. 1B, a second example of an information handling system is illustrated, according to one or more embodiments. As shown, IHS 110 may include a display 182. As illustrated, a power supply 194 may be coupled to a plug 193. For example, power supply 194 may receive alternating current via plug 193 from alternating current power supply plug 192. For instance, alternating current power supply plug 192 may provide one hundred and twenty volts (120V) alternating current power. As shown, power supply 194 may be coupled a plug 196 via coupling 195. For example, power supply 194 may provide direct current to IHS 110 via coupling 195 and a plug 196. Although power supply 194 is illustrated as external to IHS 110, power supply 194 may be external to IHS 110, or IHS 110 may include power supply 194, according to one or more embodiments.

Figure 1C:
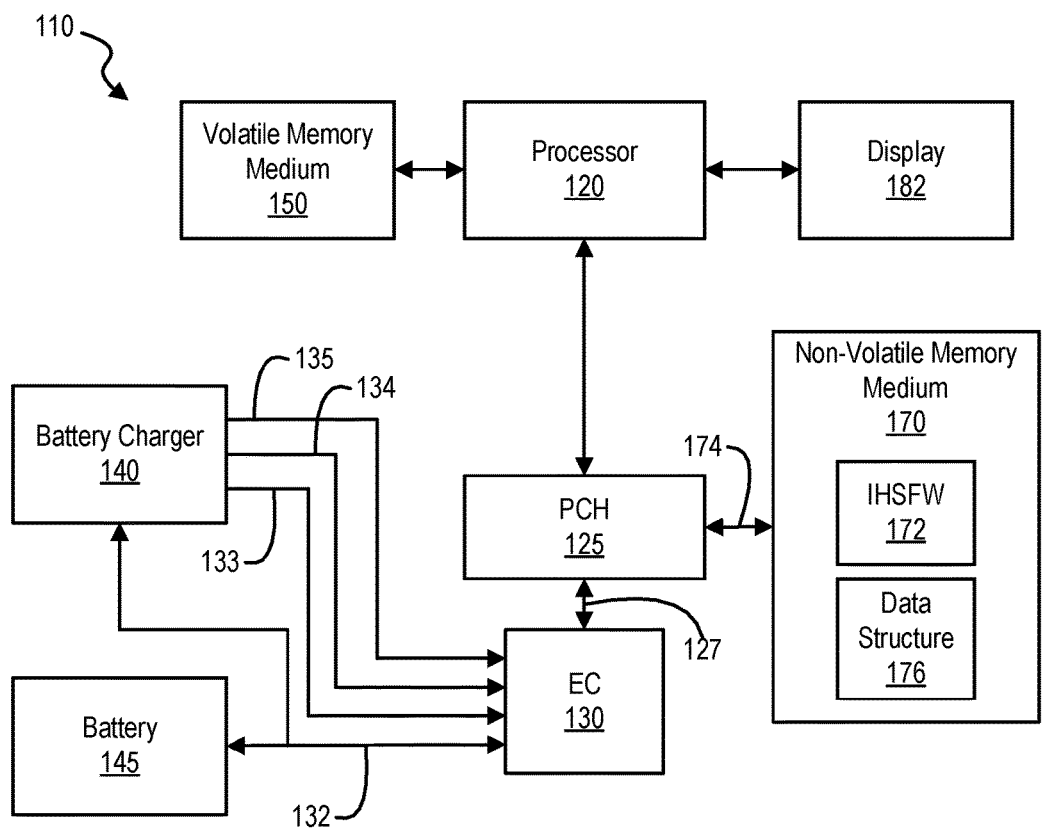
FIG. 1C illustrates another example of an information handling system, according to one or more embodiments.

Turning now to FIG. 1C, another example of an information handling system is illustrated, according to one or more embodiments. As shown, processor 120 may be coupled to volatile memory medium 150. As illustrated, processor 120 may be coupled to display 182. As shown, processor 120 may be coupled to a platform controller hub (PCH) 125. As illustrated, PCH 125 may be coupled to non-volatile memory medium 170 via a coupling 174. For example, coupling 174 may include a SPI bus. As shown, non-volatile memory medium 170 may store data structure 176, which may store data. For example, data structure 176 may include a table, which may store data. For instance, data structure 176 may include an ACPI table, which may store data.

As illustrated, PCH 125 may be coupled to EC 130 via a coupling 127. For example, coupling 127 may include an eSPI bus. As shown, EC 130 may be coupled to a battery charger 140 and battery 145 via a coupling 132. For example, coupling 132 may include a SMBus. In one or more embodiments, EC 130 may communicate with battery charger 140 and/or battery 145 via coupling 132. For example, EC 130 may receive data from battery charger 140 and/or battery 145 via coupling 132.

As illustrated, battery 145 may be coupled to battery charger 140 via coupling 132. As shown, EC 130 may be coupled to battery charger 140 via couplings 133, 134, and 135. For example, couplings 133, 134, and 135 may provide signals to EC 130. For instance, couplings 133, 134, and 135 may provide voltage signals to EC 130. In one or more embodiments, EC 130 may include one or more analog to digital converters (ADCs) that may convert one or more voltage signals to digital data. For example, the voltage signals from couplings 133, 134, and 135 may be, respectively, proportional to an amount of current from battery 145, proportional to an amount of current from power supply 194, and proportional to total system power.

In one or more embodiments, one or more ADCs may convert the voltage signals from couplings 133, 134, and 135 to digital data, which may represent digital values proportional to an amount of current from battery 145, proportional to an amount of current from power supply 194, and proportional to system power, respectively. In one example, a digital value proportional to an amount of current from battery 145 may be multiplied by a first scalar to determine a value of the amount of current from battery 145. In a second example, a digital value proportional to an amount of current from power supply 194 may be multiplied by a second scalar to determine a value of the amount of current from power supply 194. In another example, a digital value proportional to system power may be multiplied by a second scalar to determine a value of the system power.

In one or more embodiments, EC 130 may access one or more other signals from one or more components of IHS 110. For example, EC 130 may determine one or more of a voltage value, an electrical current value, and an electrical power value associated with the one or more components of IHS 110. For instance, EC 130 may provide the one or more of the voltage value, the electrical current value, and the electrical power value associated with the one or more components of IHS 110 to software and/or firmware of IHS 110.

In one or more embodiments, EC 130 may log one or more of a voltage value, an electrical current value, and an electrical power value associated with one or more components of IHS 110 and/or one or more components associated with IHS 110 (e.g., one or more components external to IHS 110 and coupled to IHS 110). For example, EC 130 may store a log of the one or more of the voltage value, the electrical current value, and the electrical power value associated with the one or more components of IHS 110 and/or the one or more components associated with IHS 110. For instance, EC 130 may provide the log to software and/or firmware of IHS 110.

Figure 1D:
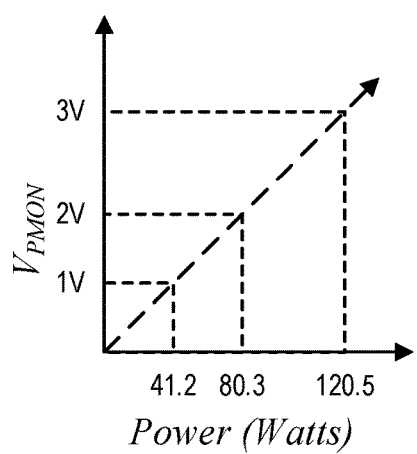
FIG. 1D illustrates an example of a relationship between a voltage signal and power values, according to one or more embodiments.

In one or more embodiments, the total system power voltage signal may be referred to as a PMON signal. For example, $V_{PMON}$ values (in volts) may indicate power values (in Watts), as illustrated in FIG. 1D. In one or more embodiments, total system power may differ from system power. In one example, system power may be the total system power less power applied to battery 145 when IHS 110 receives power from power supply 194. In one example, system power may be the total system power plus power from battery 145 when IHS 110 receives power from power supply 194 and battery 145. In another example, the system power may be the total system power when IHS 110 receives power only from battery 145.

Figure 1E:
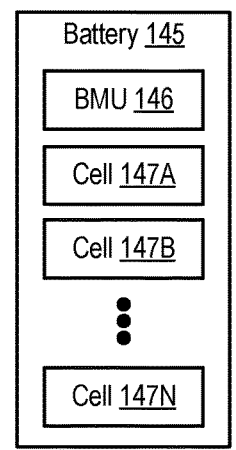
FIG. 1E illustrates an example of a battery, according to one or more embodiments.

Turning now to FIG. 1E, an example of a battery is illustrated, according to one or more embodiments. As shown, battery 145 may include a battery management unit (BMU) 146. In one or more embodiments, BMU 146 may implement at least a portion of one or more systems, at least a portion of one or more flowcharts, at least a portion of one or more methods, and/or at least a portion of one or more processes described herein. As illustrated, battery 145 may include cells 147A-147N. In one or more embodiments, battery 145 may include any number of cells 147.

In one or more embodiments, a cell 147 may store energy. For example, a cell 147 may store chemical energy. For instance, a cell 147 may provide electrical power from stored chemical energy. In one or more embodiments, a cell 147 may be rechargeable. For instance, after a cell 147 provides a first amount of energy, cell 147 may receive a second amount of energy, and cell 147 may store at least a portion of the second amount of energy. As an example, cell 147 may store the at least the portion of the second amount of energy as chemical energy. In one or more embodiments, cells 147A-147N may be coupled in one or more configurations. In one example, at least a portion of cells 147A-147N may be coupled in series. In another example, at least a portion of cells 147A-147N may be coupled in parallel.

Figure 1F:
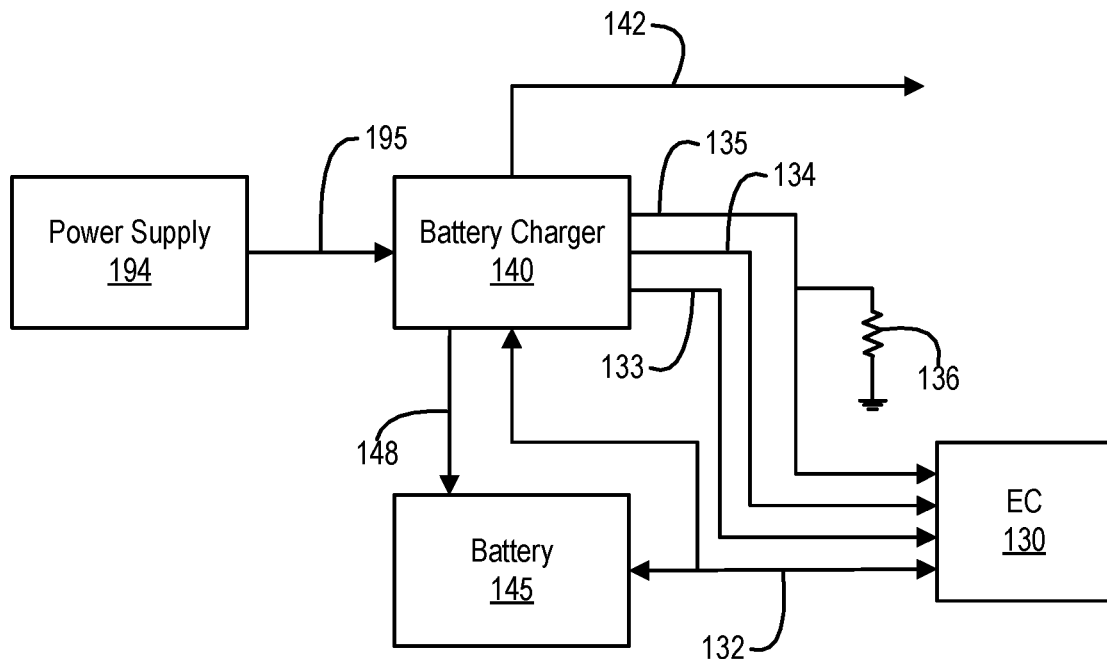
FIG. 1F illustrates an example of a power supply coupled to a battery charger, according to one or more embodiments.

Turning now to FIG. 1F, an example of a power supply coupled to a battery charger is illustrated, according to one or more embodiments. As shown, power supply 194 may be coupled to battery charger 140 via a coupling 148. In one or more embodiments, power supply 194 may provide electrical power to battery charger 140. As illustrated, battery charger 140 may provide electrical power to battery 145 via coupling 148. As shown, coupling 135 may be coupled to a resistor 136. As illustrated, resistor 136 may be coupled to ground. In one example, resistor 136 may be a pull-down resistor. In another example, resistor 136 may be a shunt resistor. In one or more embodiments, resistor 136 may be a 29.4 kΩ resistor.

In one or more embodiments, battery charger 140 may provide electrical power to one or more components of IHS 110 via coupling 142. In one example, the one or more components of IHS 110 may include one or more of processor 120, PCH 124, EC 130, volatile memory medium 150, non-volatile memory medium 160, non-volatile memory medium 170, and display 182, among others. In another example, the one or more components of IHS 110 may include one or more of processor 120, PCH 124, EC 130, volatile memory medium 150, non-volatile memory medium 160, non-volatile memory medium 170, display 182, and external peripherals coupled to IHS 110, among others.

Figure 1G:
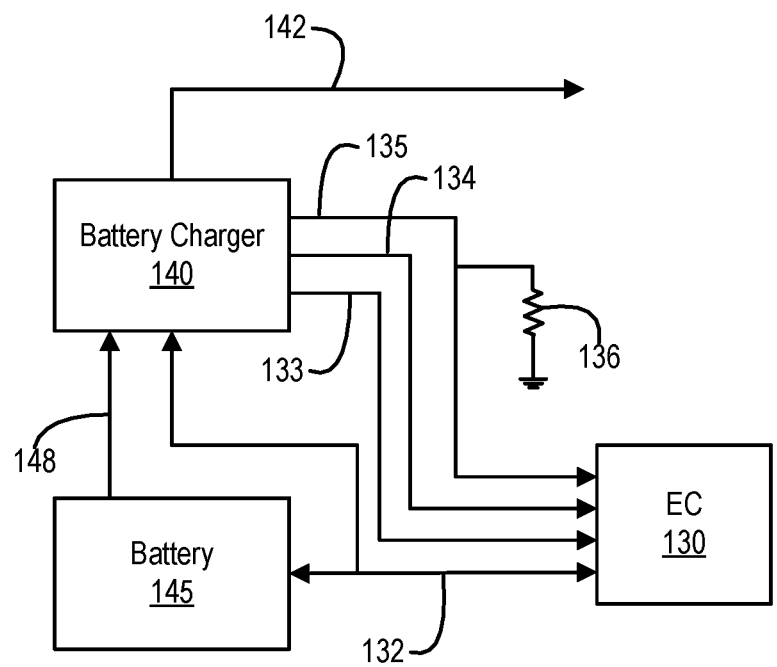
FIG. 1G illustrates an example of a battery charger without a power supply, according to one or more embodiments.

Turning now to FIG. 1G, an example of a battery charger without a power supply is illustrated, according to one or more embodiments. As shown, battery 145 may provide electrical power to battery charger 140 via coupling 148. As illustrated, coupling 135 may be coupled to resistor 136.

As shown, resistor 136 may be coupled to ground. In one example, resistor 136 may be a pull-down resistor. In another example, resistor 136 may be a shunt resistor. In one or more embodiments, resistor 136 may be a 24.9 kΩ resistor. For example:

$$\text{Total Power} = \left(\frac{V_{PMON}}{24.9k\Omega}\right) \cdot \left(\frac{\text{Watts}}{1\mu A}\right).$$

For instance, EC 130 may measure one volt (1V) across resistor 136 and may determine $$\text{Total Power} = \left(\frac{1V}{24.9k\Omega}\right) \cdot \left(\frac{\text{Watts}}{1\mu A}\right) = 41.2 \text{ Watts},$$

as shown in FIG. 1D.

In one or more embodiments, an advantage of using the PMON signal is that EC 130 only needs to determine a voltage value $V_{PMON}$ and then determine the total power utilizing the equation above for total power. For example, a previous method of determining the total power included EC 130 measuring voltage and current, and then EC 130 multiplied the voltage by the current to determine the total power.

Although resistor 136 is illustrated as external to EC 130, EC 130 may include resistor 136, according to one or more embodiments. In one or more embodiments, resistor 136 may be external to EC 130 such that resistor 136 may be configured with other resistances based at least on signals generated by battery charger 140.

In one or more embodiments, battery charger 140 may provide electrical power to one or more components of IHS 110 via coupling 142. In one example, the one or more components of IHS 110 may include one or more of processor 120, PCH 124, EC 130, volatile memory medium 150, non-volatile memory medium 160, non-volatile memory medium 170, and display 182, among others. In another example, the one or more components of IHS 110 may include one or more of processor 120, PCH 124, EC 130, volatile memory medium 150, non-volatile memory medium 160, non-volatile memory medium 170, display 182, and external peripherals coupled to IHS 110, among others.

Figure 2A:
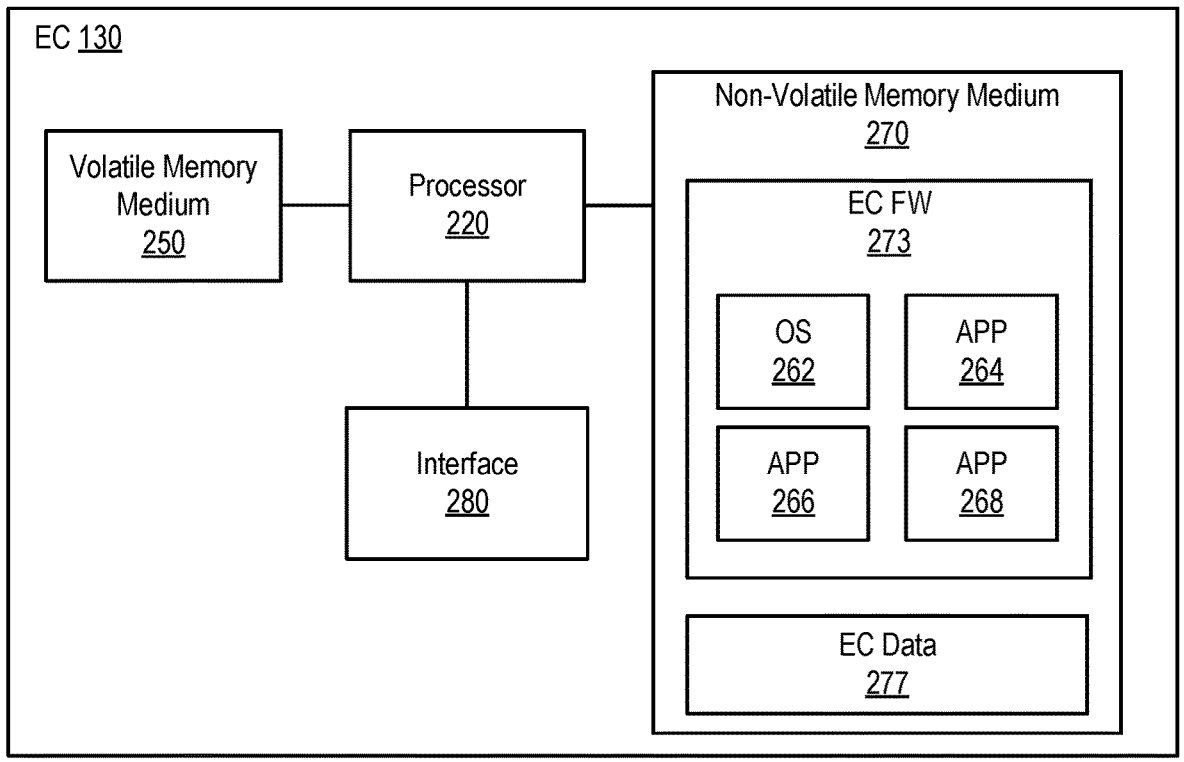
FIG. 2A illustrates an example of embedded controller, according to one or more embodiments.

Turning now to FIG. 2A, an example of embedded controller is illustrated, according to one or more embodiments. As shown, EC 130 may include a processor 220, a volatile memory medium 250, a non-volatile memory medium 270, and an interface 280. As illustrated, non-volatile memory medium 270 may include a EC firmware (FW) 273, which may include an OS 262 and APPs 264-268, and may include EC data 277. In one example, OS 262 may be or include a real-time operating system (RTOS). For instance, the RTOS may be or include FreeRTOS, OpenRTOS, SafeRTOS, QNX, ThreadX, VxWorks, NuttX, TI-RTOS, eCos, MicroC/OS, or Zephyr, among others. In a second example, OS 262 may be or include an Unix-like operating system. For instance, the Unix-like operating system may be or include LINUX®, FREEBSD®, NETBSD®, OpenBSD, Minix, Xinu, or Darwin, among others. In another example, OS 262 may be or include a portable operating system interface (POSIX) compliant operating system. Although EC 130 is illustrated with one processor, EC 130 may include multiple processors. For example, processor 220 may include multiple processor cores.

In one or more embodiments, interface 280 may include circuitry that enables communicatively coupling to one or more devices. In one example, interface 280 may include circuitry that enables communicatively coupling to one or more buses. For instance, the one or more buses may include one or more buses described herein, among others. In a second example, interface 280 may include circuitry that enables one or more interrupt signals to be received. In one instance, interface 280 may include general purpose input/output (GPIO) circuitry, and the GPIO circuitry may enable one or more interrupt signals to be received and/or provided via at least one interrupt line. In another instance, interface 280 may include GPIO circuitry that may enable EC 130 to provide and/or receive signals associated with other circuitry (e.g., diagnostic circuitry, etc.). In a third example, interface 280 may include circuitry that enables communicatively coupling to one or more networks. In one instance, interface 280 may include circuitry that enables communicatively coupling to network interface 180. In another example, interface 280 may include a network interface.

In one or more embodiments, one or more of OS 262 and APPs 264-268 may include processor instructions executable by processor 220. In one example, processor 220 may execute processor instructions of one or more of OS 262 and APPs 264-268 via non-volatile memory medium 270. In another example, one or more portions of the processor instructions of the one or more of OS 262 and APPs 264-268 may be transferred to volatile memory medium 250, and processor 220 may execute the one or more portions of the processor instructions of the one or more of OS 262 and APPs 264-268 via volatile memory medium 250. In one or more embodiments, processor 220 may execute instructions in accordance with at least a portion of one or more systems, at least a portion of one or more flowcharts, one or more methods, and/or at least a portion of one or more processes described herein. For example, non-volatile memory medium 270 and/or volatile memory medium 250 may store instructions that may be executable in accordance with at least a portion of one or more systems, at least a portion of one or more flowcharts, at least a portion of one or more methods, and/or at least a portion of one or more processes described herein. In one or more embodiments, processor 220 may execute instructions in accordance with at least a portion of one or more of systems, flowcharts, at least a portion of one or more methods, and/or at least a portion of one or more processes described herein. For example, non-volatile memory medium 270 and/or volatile memory medium 250 may store instructions that may be executable in accordance with at least a portion of one or more of systems, at least a portion of one or more flowcharts, at least a portion of one or more methods, and/or at least a portion of one or more processes described herein. In one or more embodiments, processor 220 may utilize EC data 277. In one example, processor 220 may utilize EC data 277 via non-volatile memory medium 270. In another example, one or more portions of EC data 277 may be transferred to volatile memory medium 250, and processor 220 may utilize EC data 277 via volatile memory medium 250.

Figure 2B:
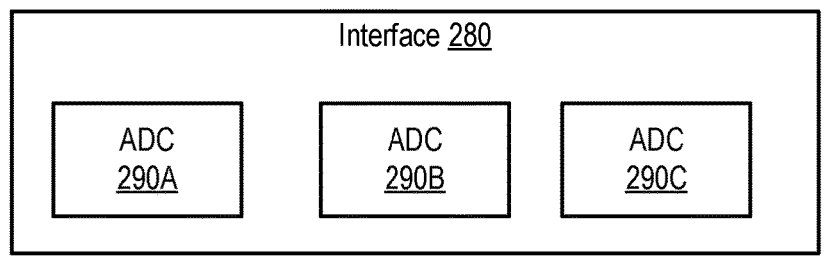
FIG. 2B illustrates an example of an interface of an embedded controller, according to one or more embodiments.

Turning now to FIG. 2B, an example of an interface of an embedded controller is illustrated, according to one or more embodiments. As shown, interface 280 may include ADCs

290A-290C. In one or more embodiments, an analog to digital converter (ADC) 290 may convert an analog signal to digital data. In one example, an ADC 290 may convert an analog voltage signal to one or more digital values associated with the analog voltage signal. For instance, a digital value of the one or more digital values associated with the analog voltage signal may include a number of volts. In another example, an ADC 290 may convert an analog electrical current signal to one or more digital values associated with the analog electrical current signal. For instance, a digital value of the one or more digital values associated with the analog electrical current signal may include a number of amperes.

In one or more embodiments, an ADC 290 may sample an analog signal at a frequency. For example, an ADC 290 may sample an analog signal at a frequency of 8 kHz, among other frequencies. In one or more embodiments, an ADC 290 may generate digital values from an analog signal that include a number of bits. In one example, an ADC 290 may generate eight-bit digital values from an analog signal. In a second example, an ADC 290 may generate twelve-bit digital values from an analog signal. In a third example, an ADC 290 may generate sixteen-bit digital values from an analog signal. In another example, an ADC 290 may generate twenty-four-bit digital values from an analog signal. In one or more embodiments, couplings 133-135 may be coupled to ADCs 290A-290C, respectively. In one or more embodiments, couplings 133-135 may be coupled to ADC 290A via a multiplexer (MUX), not specifically illustrated. For example, the MUX may permit sampling of signals from couplings 133-135 separately and/or selectively.

Figure 3A:
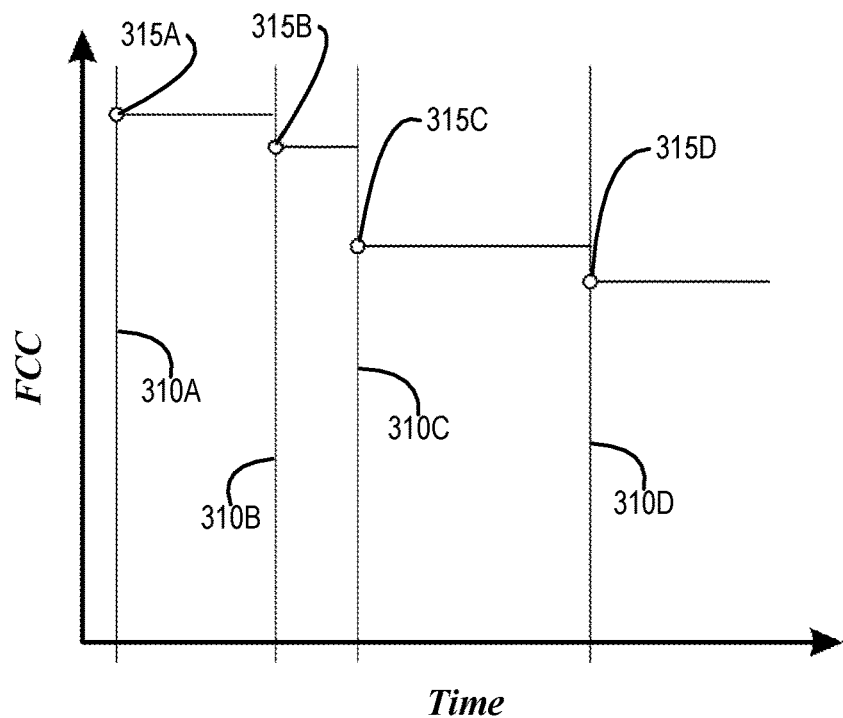
FIG. 3A illustrates an example of a series of full charge capacity measurements of a rechargeable battery over time, according to one or more embodiments.

Turning now to FIG. 3A, an example of a series of full charge capacity measurements of a rechargeable battery over time is illustrated, according to one or more embodiments. At a time 310A, a first FCC value 315A of battery 145 may be determined. The first FCC value may be utilized until a time 310B. At time 310B a second FCC value 315B of battery 145 may be determined. As illustrated, the second FCC value is lower than the first FCC value. For example, the second FCC value may be lower than the first FCC value due to degradation of battery 145. In one or more embodiments, the second FCC value may be utilized during a next time interval until a third FCC value 315C may be determined at a time 310C. As shown, the third FCC value is lower than the second FCC value. For example, the third FCC value may be lower than the second FCC value due to further degradation of battery 145. In one or more embodiments, the third FCC value may be utilized during a next time interval until a fourth FCC value 315D may be determined at a time 310D. As shown, the fourth FCC value is lower than the third FCC value. For example, the fourth FCC value may be lower than the third FCC value due to further degradation of battery 145. As illustrated, a time interval between times 310A and 310B may be different than a time interval between times 310B and 310C. As shown, a time interval between times 310B and 310C may be different than a time interval between times 310C and 310D. In one or more embodiments, time intervals between FCC value determinations may vary.

Figure 3B:
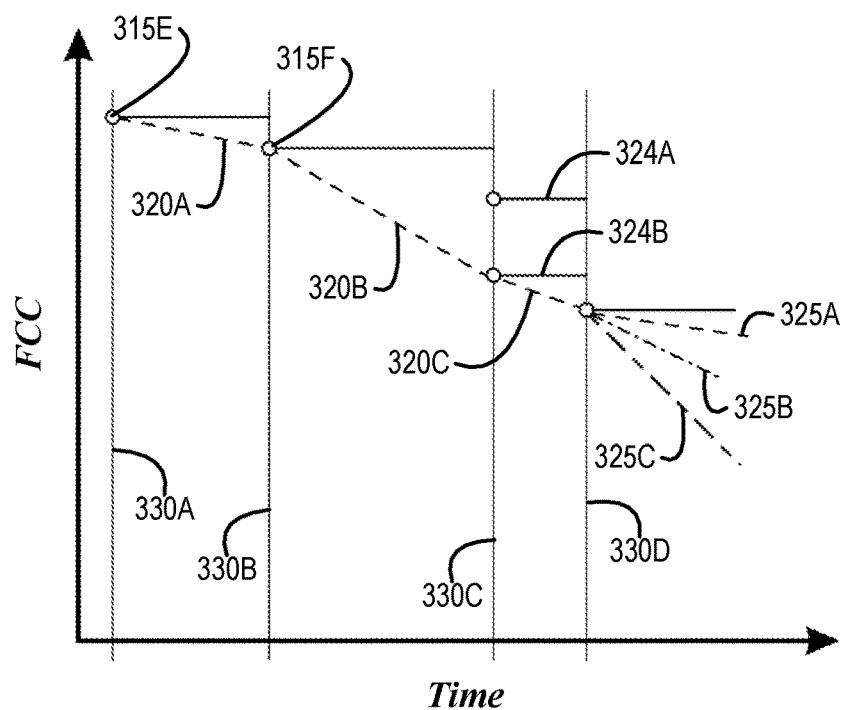
FIG. 3B illustrates examples of battery charge capacity estimates, according to one or more embodiments.

Turning now to FIG. 3B, examples of battery charge capacity estimates are illustrated, according to one or more embodiments. In one or more embodiments, estimates of remaining battery capacity may be utilized to provide users with battery status reports, such as a percentage of remaining battery capacity that is available for use. Such estimates may attempt to account for battery degradation since the last FCC determination of the battery. Without using estimates that account for battery degradation, significant discrepancies may arise between actual remaining capacity of battery 145 and reported remaining battery capacity. For instance, this may potentially result in battery failure.

At a time 330A, a first FCC value 315E may be determined. During a time interval from time 330A to a time 330B, the first FCC value may be an actual value of a capacity of battery 145 that may be available for utilization in generating reports of remaining available capacity of battery 145. During the time interval from time 330A to time 330B, an estimated FCC values 320A may be utilized. For example, a constant rate of battery degradation may be applied for the time interval from time 330A to time 330B. For instance, a FCC value during the time interval from time 330A to time 330B may be based at least on estimated FCC values 320A with respect to time.

At time 330B, a second FCC value 315F may be determined. The second FCC value may be an actual measurement of capacity of battery 145 during a time interval between time 330B and a time 330C. As illustrated, the time interval between time 330A and time 330B and the time interval between time 330B and time 330C may be different. During the time interval from time 330B to time 330C, an estimated FCC values 320B may be utilized. For example, a constant rate of battery degradation may be applied for the time interval from time 330B to time 330C. For instance, a FCC value during the time interval from time 330B to time 330C may be based at least on estimated FCC values 320B with respect to time.

At time 330C, a third FCC value 315G may be determined. The third FCC value may be an actual measurement of capacity of battery 145 during a time interval between time 330B and a time 330C. As illustrated, the time interval between time 330A and time 330B and the time interval between time 330B and time 330C may be different. During the time interval from time 330B to time 330C, an estimated FCC values 320B may be utilized. For example, a constant rate of battery degradation may be applied for the time interval from time 330B to time 330C. For instance, a FCC value during the time interval from time 330B to time 330C may be based at least on estimated FCC values 320B with respect to time.

At a time 330D, a fourth battery capacity measurement may be determined. As illustrated, potential battery capacity estimates 325A-325C may be selected for utilization during a time interval after time 330D. In one or more embodiments, battery capacity estimates 325A-325C may be determined by applying respective rates of degradation of battery 145. In one or more embodiments, a selection of a battery capacity estimate from battery capacity estimates 325A-325C may be based at least on determined rates of degradation during prior time intervals. However, for example, such estimates may not take into account characteristics of battery utilization during a time interval after time 330D, which may result in a potential for significant discrepancies between estimated capacity of battery 145 and actual capacity of battery 145.

For instance, at time 330C, two possible battery capacity measurements 324A and 324B are illustrated. Battery capacity determination 324B may conform to the battery degradation of the estimated battery capacity 320B during the time interval from time 330B to time 3C. In such scenarios, estimated battery capacity 320B may be a reasonably accurate projection of the actual battery capacity degradation during this time interval. Such accuracy may be attributed to the estimated battery capacity 320B applying a degradation rate that may be consistent with prior degradation rates of battery 145 and battery operations that may be consistent across the time intervals.

In one or more embodiments, user behavior and/or other circumstances may result in actual degradation being significantly different during these two intervals. For example, during the time interval between time 330B and 330C, IHS 110 may have been coupled to an external power source for one or more periods of time and may have been subjected to few events and conditions that may contribute to battery degradation. In such scenarios, the actual battery degradation may instead be reflected by the battery capacity determination 324A, which may not conform to the estimated battery capacity 320B. In such circumstances, the use of estimates that may not account for actual circumstances of battery discharges during this time interval may result in discrepancies between the battery capacity estimates and the actual battery capacity. In scenarios, such as in FIG. 3B, where a battery capacity estimate 320B is lower than the actual capacity 324A, discrepancies may result in loss of use of IHS 110. A user may be provided with incorrect battery power information, which may cause a user to prematurely power down IHS 110. Automatic battery protection mechanisms may also prematurely power down an IHS 110 based at least on such wayward and/or imprecise battery capacity estimates.

Figure 3C:
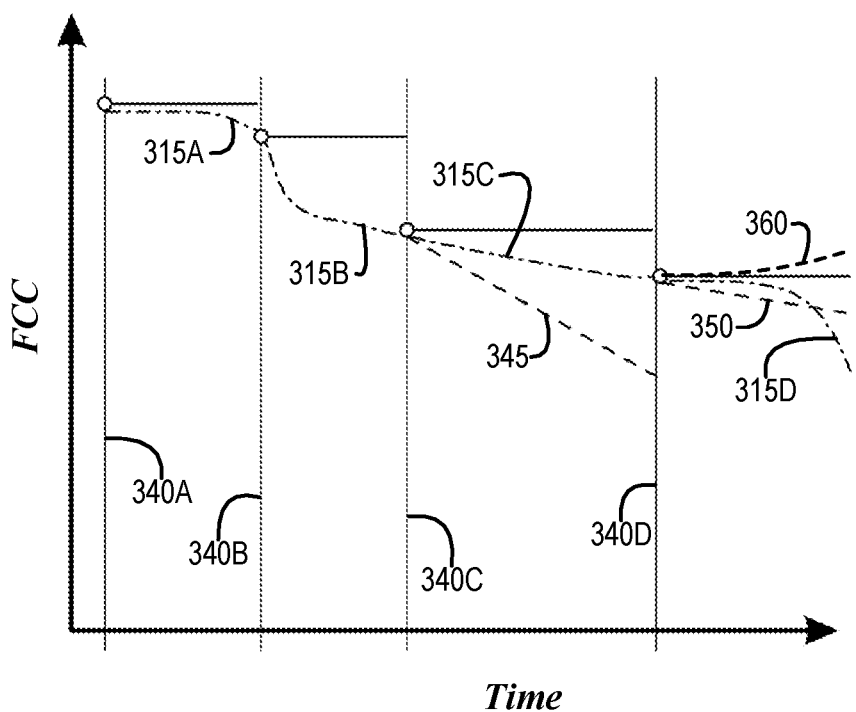
FIG. 3C illustrates example battery capacity forecasts, according to one or more embodiments.

Turning now to FIG. 3C, example battery capacity forecasts are illustrated, according to one or more embodiments. As described, the full charge capacity of a rechargeable battery degrades based at least on various events and conditions during use of the battery, such as a number of battery discharge cycles and/or depths of battery discharge cycles. As described with reference to FIG. 3B, estimates of a full charge capacity of battery 145 that may not account for conditions of actual battery utilization may result in inaccurate estimates of available battery power. In one or more embodiments, one or more systems may be configured to generate battery capacity forecasts that may account for historical battery utilization as well as ongoing utilization of battery 145 since a last FCC determination, where such battery capacity forecasts may be used during time intervals between battery capacity determinations.

In one or more embodiments, BMU 146 may be configured to collect one or more values pertaining to operations of battery 145. For example, the one or more values pertaining to operations of battery 145 may include capacity measurements and information describing utilization and discharge cycles of battery 145, among others. The collected battery information may then be provided as inputs to one or more machine learning systems that may determine battery capacity correction factors, which may be utilized by to determine accurate battery capacity forecasts. As described in additional detail with regard to FIG. 4, such battery capacity forecasts may be initially determined for a particular information handling system based at least on aggregated battery operation information received from numerous information handling systems and may subsequently be determined based at least on battery operation information from a particular information handling system, which may provide battery capacity estimates that account for battery operations of the particular information handling system.

In one or more embodiments, FIG. 3C illustrates example battery capacity forecasts that may be determined, where the forecasts may be utilized during time intervals between full charge capacity determinations of battery 145. At time 340A, a first battery capacity measurement may be determined and may remain the operative battery capacity measurement until a second measurement is taken at a time 340B.

In one or more embodiments, battery capacity forecasts 315A may be determined during a time interval between time 340A and time 340B by a machine learning model that has been trained using aggregated battery operation information. Initially, the battery capacity forecasts 315A may be determined based at least on an aggregated battery model. As information associated with parameters of operation of battery 145 are collected, the information may be provided to the machine learning model, which may determine capacity forecasts for battery 145 based at least on the information associated with the parameters of operation of battery 145.

In one or more embodiments, battery capacity forecasts 340A during the time interval between times 340A and 340B may reflect machine learning estimates that presume ideal battery operations, which may result in a minimal initial degradation but may also determine estimates of greater degradation over time as reported battery operations indicate battery operations associated with moderate battery degradation. At time 340B, a second battery capacity value may be determined. As illustrated, a second time interval between times 340B and 340C may be greater than the time interval between times 340A and 340B.

As shown with battery capacity forecasts 315B determined by the machine learning model during the time interval between times 340B and 340C, an operational utilization of battery 145 may have resulted in a forecast of significant and/or rapid battery capacity degradation during the time interval between times 340B and 340C. For instance, battery 145 may have been subjected to a large number of discharge cycles, which may have resulted in deep and/or rapid discharges of battery 145. Such characteristics of BMU 146 may be monitored. In one or more embodiments, the characteristics may be provided to the machine learning model. In one or more embodiments, based at least on such reported battery operations, the machine learning model may determine battery capacity forecasts 315B, which may reflect an expected rapid degradation of a capacity of battery 145. For example, this degradation may be confirmed at a subsequent battery capacity value determination at time 340C.

During a third time interval (between times 340C and 340D) of battery operations that may subject to the battery capacity value determination at time 340C, battery 145 may be regularly charged with infrequent instances of deep discharge cycles. This change in battery operations may be reflected in battery capacity forecasts 315C determined by the machine learning model during the time interval time interval between times 340C and 340D. Without accounting for actual battery operations during the third time interval, estimates of battery capacity may be based at least on previous battery degradation values during prior time intervals, such as described with regard to FIG. 3B. In the scenario illustrated in FIG. 3B, such a battery capacity estimate 345 is illustrated in FIG. 3C, where this estimate presumes a high rate of degradation that is commensurate with the rate of degradation observed during the prior time interval. As illustrated, such a battery capacity estimate 345 may result in a significant discrepancy from the actual battery capacity measurement taken at time 340D. Such a discrepancy may be eliminated by the battery capacity forecasts 315C determined during by the machine learning model, which may account for improved care of battery 145.

As illustrated in battery capacity forecasts 315D, during a first portion of a fourth time interval that commences with the battery capacity value is determined at time 340D, battery operations may continue to indicate minimal degradation. However, continued battery operation monitoring may indicate another period of rapid and/or deep discharges of battery 145 during a second portion of the fourth time interval, commencing after time 340D. These inputs to the machine learning model may be reflected in the rapid battery degradation anticipated by battery capacity forecast 315D. As illustrated, an estimate 350 of battery capacity, which may be determined based at least on degradation observed during the prior time interval, may result in a discrepancy that overestimates battery capacity relative to the battery capacity forecast 315D, which may account for occurrence of high degradation events observed during the second portion of this time interval. In one or more embodiments, an estimate 360 of battery capacity may indicate a recovery. For example, an estimate 360 of battery capacity may indicate a recovery. For instance, a value of $C_{fcc}$ may be less than zero (0) based at least on estimate 360 of battery capacity.

Figure 4:
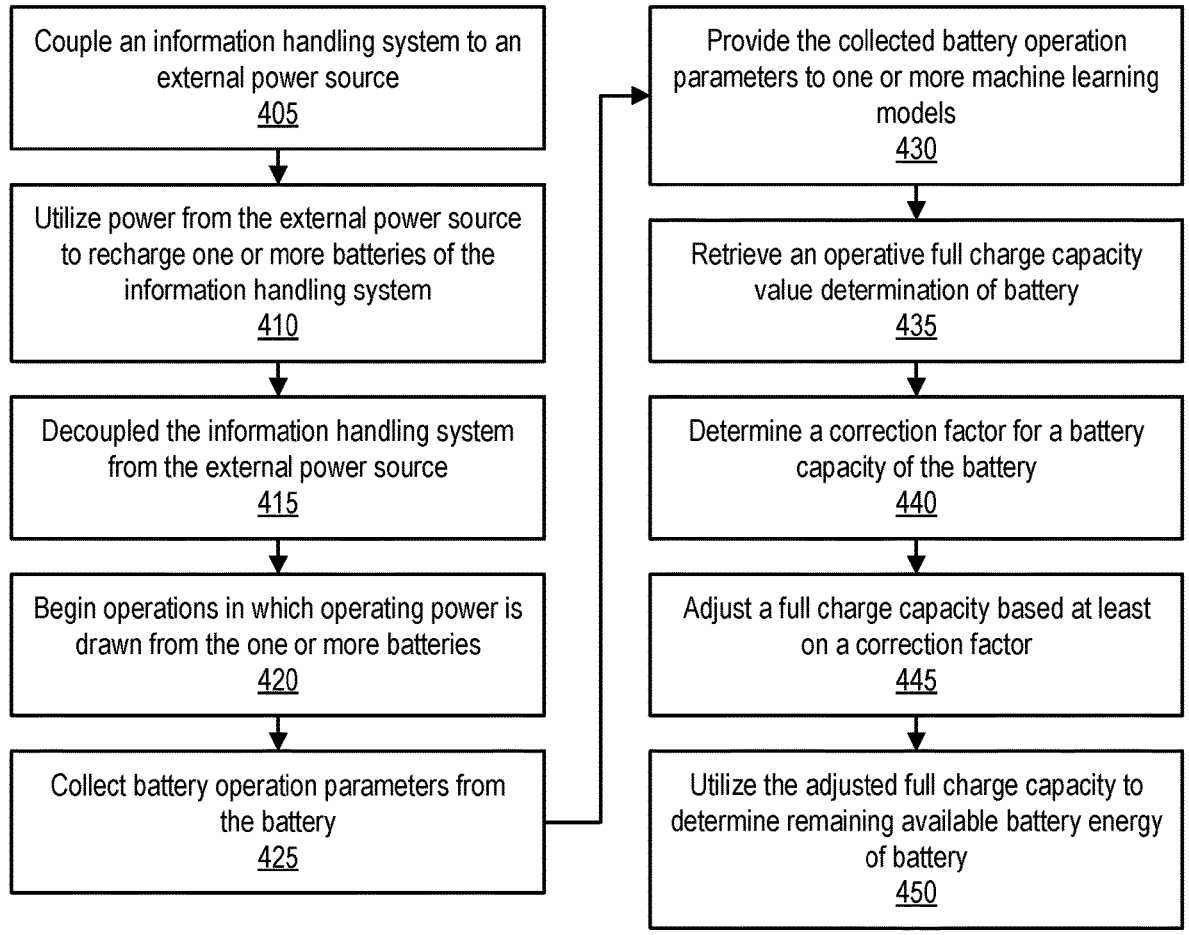
FIG. 4 illustrates an example of a method of battery charge capacity forecasting, according to one or more embodiments.

Turning now to FIG. 4, an example of a method of battery charge capacity forecasting is illustrated, according to one or more embodiments. At 405, an information handling system may be coupled to an external power source. For example, IHS 110 may be coupled to power supply 194. In one or more embodiments, coupling IHS 110 to power supply 194 may include coupling power supply 194 to alternating current power supply plug 192.

At 410, power from the external power source may be utilized to recharge one or more batteries of the information handling system. In one example, EC 130 may utilize power from the external power source to recharge battery 145. In another example, BMU 146 may utilize power from the external power source to recharge battery 145. For instance, BMU 146 may utilize power from the external power source to recharge cells 147A-147N.

At 415, the information handling system may be decoupled from the external power source. For example, IHS 110 may be decoupled from power supply 194. In one or more embodiments, decoupling IHS 110 from the external power source may include decoupling power supply 194 to alternating current power supply plug 192 while not decoupling IHS 110 from power supply 194.

At 420, the information handling system may begin operations in which operating power is drawn from the one or more batteries. For example, IHS 110 may begin operations in which operating power is drawn from battery 145.

At 425, battery operation parameters may be collected from a battery management unit. For example, EC 130 may collect battery operation parameters from battery 145. For instance, EC 130 collecting battery operation parameters from battery 145 may include EC 130 collecting battery operation parameters from BMU 146. In one or more embodiments, BMU 146 may provide the battery operation parameters to EC 130.

At 430, the collected battery operation parameters may be reported for utilization in development of one or more machine learning models of battery degradation. For example, EC 130 may provide the collected battery operation parameters to one or more machine learning models. In one or more embodiments, the collected battery operation parameters may be utilized to train the one or more machine learning models. For example, EC 130 may utilize an estimate of available battery capacity from the one or more machine learning models. For instance, EC 130 may utilize the estimate of available battery capacity to trigger and/or commence one or more automatic transitions to one or more low-power states of IHS 110.

At 435, an operative full charge capacity value determination of the one or more batteries may be retrieved. For example, EC 130 may retrieve an operative full charge capacity value determination of battery 145. In one or more embodiments, BMU 146 may be configured to determine a FCC value of battery 145, where such values may be triggered by discharges of battery 145 below a threshold battery capacity value. For example, BMU 146 may store the operative full charge capacity value and/or one or more prior full charge capacity values and times when the values were determined.

At 440, a correction factor (e.g., $C_{fcc}$) may be determined for a battery capacity. For example, EC 130 may determine a correction factor for a battery capacity of battery 145. In one or more embodiments, the correction factor may be determined as an output of a machine learning model of battery degradation. In one or more embodiments, during initial utilization of a rechargeable battery (e.g., battery 145), one or more correction factors may be generated utilizing a machine learning model of battery degradation trained based at least on battery operations from battery degradation data collected from multiple information handling systems. For example, the multiple information handling systems may be from a corporate network and/or from participant information handling systems in a data collection initiative, among others.

As utilization of battery 145 continues and as characteristics of the operation of battery 145 are collected for IHS 110, the machine learning model of battery degradation may be adapted to battery operations for IHS 110. In this fashion, a particularized model of battery degradation may be generated specifically for IHS 110. For example, the particularized model of battery degradation may account for specific patterns of battery operation by a particular user during time intervals between determining battery capacity values.

In one or more embodiments, utilizing a battery degradation machine learning model that accounts for ongoing battery operations, more accurate estimates of available battery capacity may be provided between determining battery capacity values. For example, a user may alternate between time intervals where IHS 110 is maintained in a mostly charged state and time intervals where IHS 110 is regularly discharged deeply in a rapid manner.

In one or more embodiments, monitoring such battery discharge characteristics, BMU 146 may generate data that may be utilized by the machine learning model to generate a battery capacity correction factor that may account for both the time intervals of low degradation and the time intervals of high battery degradation, which may result from a discharge of battery 145.

In one or more embodiments, BMU 146 may detect specific events that are recognized as resulting in significant reductions in the full charge capacity of battery 145. For example, a user may neglect to couple IHS 110 to an external power source for a period of time, which may result in a complete discharge of battery 145. This may cause significant battery degradation. In one or more embodiments, BMU 146 may detect high temperature events that may result from various battery operations, such as rapid discharge rates from battery 145 and/or exposure of IHS 110 to high temperatures.

In one or more embodiments, in addition to or in alternative to monitoring for battery events that may adversely affect battery degradation, collected battery operation information may be evaluated over time to determine conditions of battery utilization that may adversely affect battery degradation. For example, temperature data may be tracked over time to determine time intervals of battery utilization within one or more temperature ranges. For instance, durations of battery utilization within each of the monitored temperature ranges may indicate different rates of battery degradation. In one or more embodiments, reporting actual battery degradation information to the machine learning model in a form of full charge capacity values, effects on battery degradation by time intervals of battery operations within each of the one or more temperature ranges may be identified and utilized in providing a correction factor that may account for conditions in which the battery is being utilized.

In one or more embodiments, utilization of temperature range information may be utilized by one or more machine learning models to generate one or more general temperature range correction factors that may be applied as inputs to a machine learning model of a specific battery (e.g., battery 145). In this fashion, generalized battery degradation machine learning models may be continued to be trained utilizing battery operation information from multirole information handling systems, while also using the battery degradation information as correction factor inputs to one or more battery degradation machine learning models. For example, battery information such as a discharge rate may be similarly monitored and characterized within discharge rate ranges. Time intervals of discharge rates within each of the ranges may be identified and provided as additional inputs to one or more degradation machine learning models. In one or more embodiments, in conjunction with reported battery degradation in a form of full charge capacity values, discharge rate range information may be evaluated by one or more machine learning models in characterizing an impact of discharge rates on battery degradation. In one or more embodiments, based at least on such monitored battery operations, a battery capacity machine learning model may be utilized to generate a battery capacity correction factor that may account for ongoing battery operations between determining battery capacity values.

At 445, a full charge capacity may be adjusted based at least on a correction factor. For example, EC 130 may adjust a full charge capacity based at least on a correction factor. For instance, EC 130 may determine an adjusted full charge capacity based at least on a full charge capacity and a correction factor. As an example, the correction factor may be subtracted from the full charge capacity.

At 450, the adjusted full charge capacity may be utilized to determine remaining available battery energy (or level of energy). For example, EC 130 may utilize the adjusted full charge capacity to determine remaining available battery energy (or level of energy) of battery 145. In one or more embodiments, a remaining amount of time that IHS 110 may function utilizing battery 145 may be determined based at least on the adjusted full charge capacity.

Figures 5A, 5B:
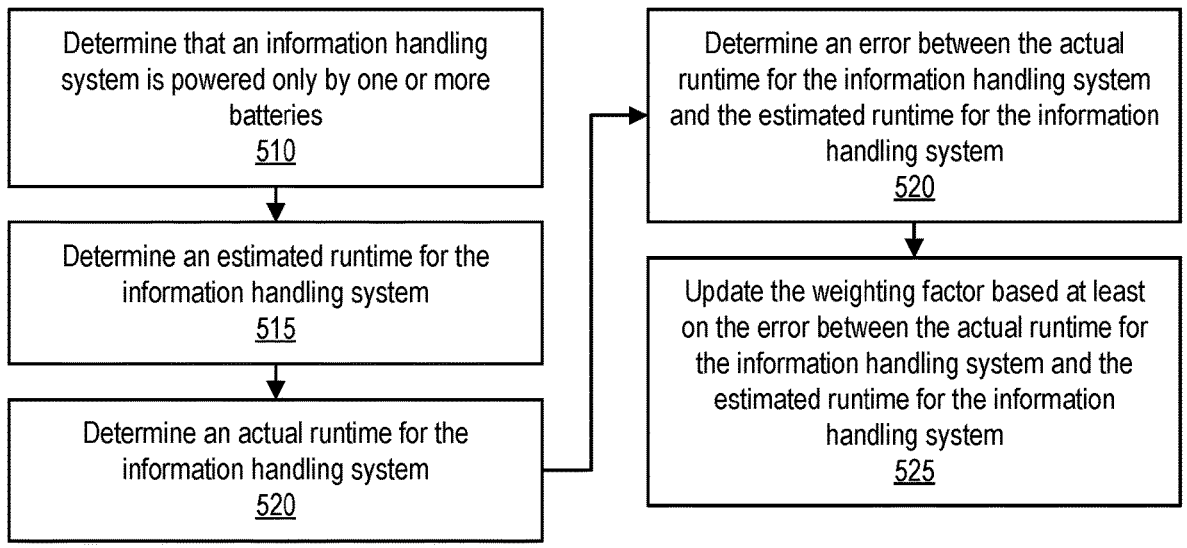
FIG. 5A illustrates an example of a method of determining an estimated runtime of an information handling system that operates off one or more batteries, according to one or more embodiments.
FIG. 5B illustrates an example of an equation utilized in determining an estimated runtime of an information handling system that operates off one or more batteries, according to one or more embodiments.

Turning now to FIG. 5A, an example of a method of determining an estimated runtime of an information handling system that operates off one or more batteries is illustrated, according to one or more embodiments. At 510, it may be determined that an information handling system is powered only by one or more batteries. For example, one or more of an application, a service, IHSFW 172, and EC 130, among others, may determine that IHS 110 is powered only by battery 145.

At 515, an estimated runtime for the information handling system may be determined. For example, the one or more of the application, the service, IHSFW 172, and EC 130, among others, may determine an estimated runtime for IHS 110. In one or more embodiments, an estimated runtime for the information handling system may be determined via an equation 550. In equation 550: FCC may be a fully charged capacity of a battery (e.g., battery 145); $C_{fcc}$ may be a correction factor; $\alpha$ may be a weighting factor; $d_h$ may be a historic discharge rate of the battery; $d_c$ may be a current discharge of the battery; and $R_{SOC}$ may be a relative state of charge of the battery. In one or more embodiments, $\alpha$ (the weighting factor) may be utilized to proportion utilizations of $d_h$ and $d_c$. In other words, for example, $\alpha$ (the weighting factor) may be utilized to determine how much of the estimated runtime is based at least on a historic discharge rate of the battery and how much of the estimated runtime is based at least on a current discharge of the battery. In one or more embodiments, if there are no prior updates of the weighting factor ($\alpha$), the weighting factor may be set to one half (0.5).

At 520, an actual runtime for the information handling system may be determine. For example, the one or more of the application, the service, IHSFW 172, and EC 130, among others, may determine an actual runtime for IHS 110.

At 525, an error between the actual runtime for the information handling system and the estimated runtime for the information handling system may be determined. For example, the one or more of the application, the service, IHSFW 172, and EC 130, among others, may determine an error between the actual runtime for IHS 110 and the estimated runtime for IHS 110.

At 530, the weighting factor ($\alpha$ of equation 550) may be updated based at least on the error between the actual runtime for the information handling system and the estimated runtime for the information handling system. For example, the one or more of the application, the service, IHSFW 172, and EC 130, among others, may update the weighting factor ($\alpha$ of equation 550) based at least on the error between the actual runtime for the information handling system and the estimated runtime for the information handling system.

In one or more embodiments, when there is high variability in battery utilization, the weighting factor may trend towards zero (0). For example, when there is high variability in battery utilization, historic discharge rate ($d_h$) may not provide much aid in determining an estimated runtime for the information handling system powered only by the one or more batteries. In one or more embodiments, when there are similar usage patterns of the one or more batteries of the information handling system, the weighting factor may trend towards one (1). For example, when there are similar usage patterns of the one or more batteries of the information handling system, historic discharge rate ($d_h$) may provide much aid in determining an estimated runtime for the information handling system powered only by the one or more batteries.

Figures 5C, 5D:
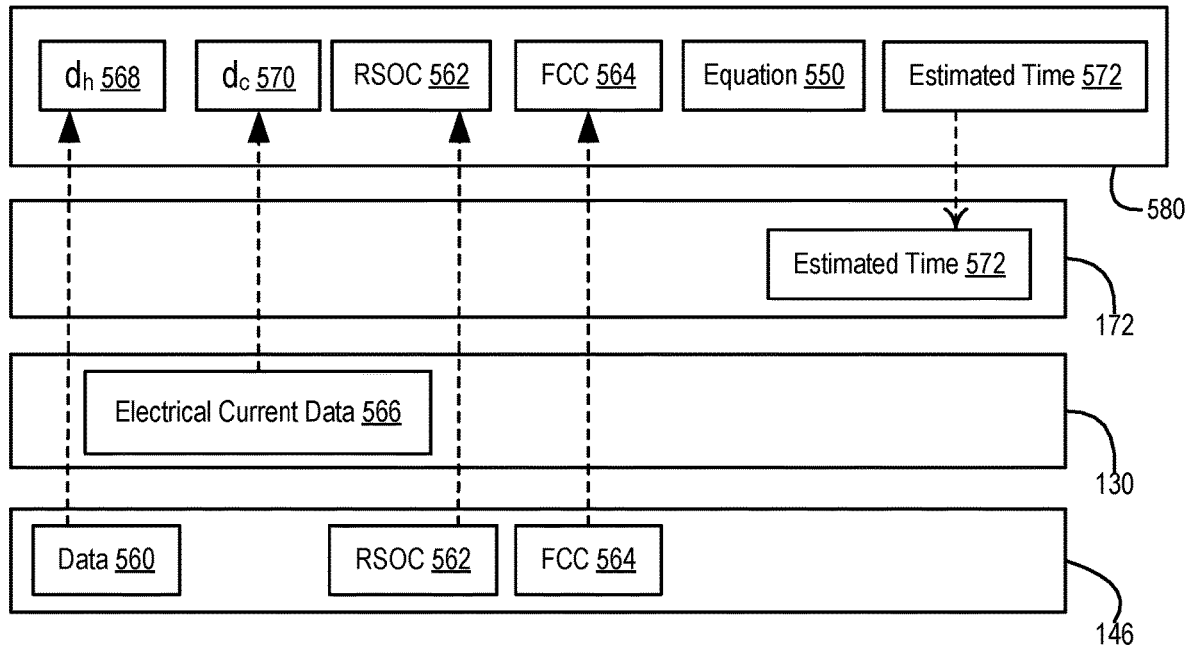
FIG. 5C illustrates an example of a battery management unit, an embedded controller, information handling system firmware, and processor executable instructions utilized in determining an estimated runtime of an information handling system that operates off one or more batteries, according to one or more embodiments.
FIG. 5D illustrates an example of data that shows a number of minutes for a temperature range and a charge rate range, according to one or more embodiments.

Turning now to FIG. 5C, an example of a battery management unit, an embedded controller, information handling system firmware, and processor executable instructions utilized in determining an estimated runtime of an information handling system that operates off one or more batteries is illustrated, according to one or more embodiments.

As shown, BMU 145 may include data 560. For example, BMU 145 may store data 560. In one or more embodiments, BMU 145 may provide data 560 to an agent 580. For example, agent 580 may receive data 560. For instance, agent 580 may store at least a portion of data 560 as $d_h$ 568. An example, of is illustrated in FIG. 5D, which shows a number of minutes for a temperature range and a charge rate range. In one or more embodiments, agent 580 may include processor-executable instructions. In one example, agent 580 may include instructions executable by processor 120. In another example, agent 580 may include instructions executable by processor 220. With reference to data 560, time spent in each charge rate range may be aggregated, according to one or more embodiments. Design capacity (e.g., energy capacity in Watt·hours) of battery 145 may be utilized. A distribution of discharge rate may be determined. In one or more embodiments, a mean discharge rate may be determined for $d_h$ 568.

As illustrated, BMU 145 may include RSOC 562. For example, BMU 145 may store RSOC 562. In one or more embodiments, BMU 145 may provide RSOC 562 to agent 580. For example, agent 580 may receive RSOC 562. As shown, BMU 145 may include FCC 564. For example, BMU 145 may store FCC 564. In one or more embodiments, BMU 145 may provide FCC 564 to agent 580. For example, agent 580 may receive FCC 564.

As illustrated, EC 130 may include electrical current data 566. For example, EC 130 may store electrical current data 566. In one or more embodiments, EC 130 may provide electrical current data 566 to agent 580. For example, agent 580 may receive electrical current data 566. In one or more embodiments, EC 130 may determine electrical current data 566 based at least on one or more voltage signals via coupling 135. For example, electrical current data 566 may indicate an amount of current provided to one or more components of IHS 110. In one instance, the one or more components of IHS 110 may include one or more of processor 120, PCH 124, EC 130, volatile memory medium 150, non-volatile memory medium 160, non-volatile memory medium 170, and display 182, among others. In another instance, the one or more components of IHS 110 may include one or more of processor 120, PCH 124, EC 130, volatile memory medium 150, non-volatile memory medium 160, non-volatile memory medium 170, display 182, and external peripherals coupled to IHS 110, among others.

In one or more embodiments, current data 566 may be provided to agent 580. Current data 566 may be utilized to determine $d_c$ 570. As shown, agent 580 may utilize equation 550 to determine remaining estimated time 572. As illustrated, agent 580 may provide remaining estimated time 572 to IHSFW 172. For example, agent 580 may utilize a management information exchange to provide remaining estimated time 572 to IHSFW 172. For instance, agent 580 may utilize one or more of WMI and CIM, among others, to provide remaining estimated time 572 to IHSFW 172. Although FIG. 5C illustrates providing remaining estimated time 572 to IHSFW 172, remaining estimated time 572 may provided to one or more components of IHS 110 and/or to software executing via processor 120. For example, remaining estimated time 572 may provided to one or more of OS 162, APPs 164-168, EC 130, OS 262, and APPs 264-268, among others.

Figure 6:
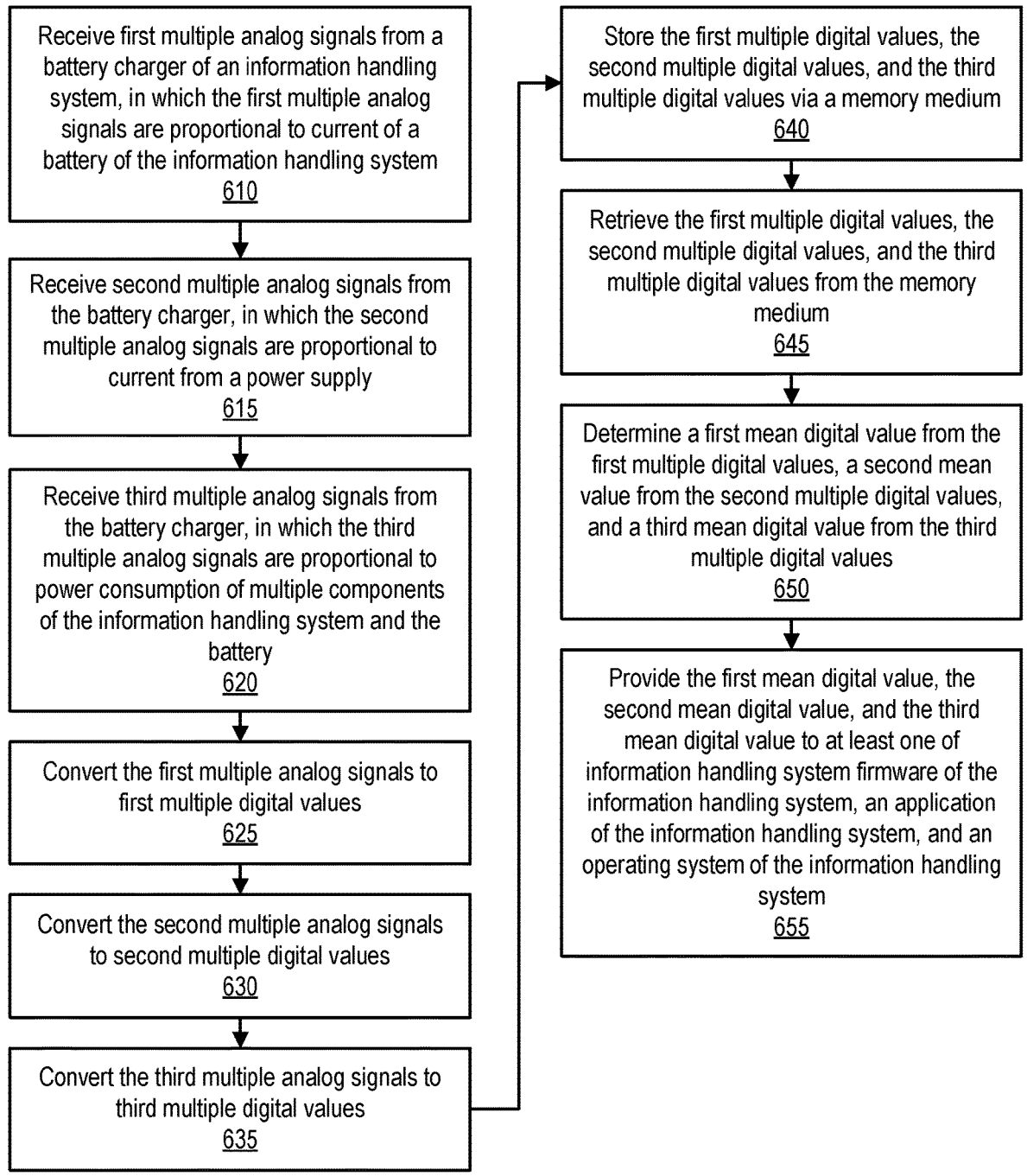
FIG. 6 illustrates an example of a method of determining power utilization of an information handling system, according to one or more embodiments.

Turning now to FIG. 6, an example of a method of determining power utilization of an information handling system is illustrated, according to one or more embodiments. At 610, first multiple analog signals from a battery charger of an information handling system may be received, in which the first multiple analog signals are proportional to current of a battery of the information handling system. For example, EC 130 may receive first multiple analog signals from battery charger 140 of IHS 110, in which the first multiple analog signals are proportional to current of battery 145 of IHS 110.

At 615, second multiple analog signals from the battery charger may be received, in which the second multiple analog signals are proportional to current from a power supply. For example, EC 130 may receive second multiple analog signals from battery charger 140, in which the second multiple analog signals are proportional to current from power supply 194.

At 620, third multiple analog signals from the battery charger may be received, in which the third multiple analog signals are proportional to power consumption of multiple components of the information handling system and the battery. For example, EC 130 may receive third multiple analog signals from battery charger 140, in which the third multiple analog signals are proportional to power consumption of multiple components of the information handling system and battery 145.

At 625, the first multiple analog signals may be converted to first multiple digital values. For example, EC 130 may convert the first multiple analog signals to first multiple digital values. At 630, the second multiple analog signals may be converted to second multiple digital values. For example, EC 130 may convert the second multiple analog signals to second multiple digital values.

At 635, the third multiple analog signals may be converted to third multiple digital values. For example, EC 130 may convert the third multiple analog signals to third multiple digital values. At 640, the first multiple digital values, the second multiple digital values, and the third multiple digital values may be stored via a memory medium. For example, EC 130 may store the first multiple digital values, the second multiple digital values, and the third multiple digital values via a memory medium. For instance, EC 130 may store the first multiple digital values, the second multiple digital values, and the third multiple digital values via one or more of memory media 150, 160, 170, 250, and 270, among others.

At 645, the first multiple digital values, the second multiple digital values, and the third multiple digital values may be retrieved from the memory medium. For example, EC 130 may retrieve the first multiple digital values, the second multiple digital values, and the third multiple digital values from the memory medium. For instance, EC 130 may retrieve the first multiple digital values, the second multiple digital values, and the third multiple digital values from the one or more of memory media 150, 160, 170, 250, and 270, among others.

At 650, a first mean digital value may be determined from the first multiple digital values, a second mean value may be determined from the second multiple digital values, and a third mean digital value may be determined from the third multiple digital values. For example, EC 130 may determine a first mean digital value from the first multiple digital values, a second mean value from the second multiple digital values, and a third mean digital value from the third multiple digital values. In one or more embodiments, a mean determined from values may include an arithmetic mean determined from the values, a geometric mean determined from the values, or a harmonic mean determined from the values, among others.

At 655, the first mean digital value, the second mean digital value, and the third mean digital value may be provided to at least one of information handling system firmware of the information handling system, an application of the information handling system, and an operating system of the information handling system, among others. For example, EC 130 may provide the first mean digital value, the second mean digital value, and the third mean digital value to at least one of IHSFW 172, an APP of APPs 164-168, and OS 162, among others.

Figure 7A:
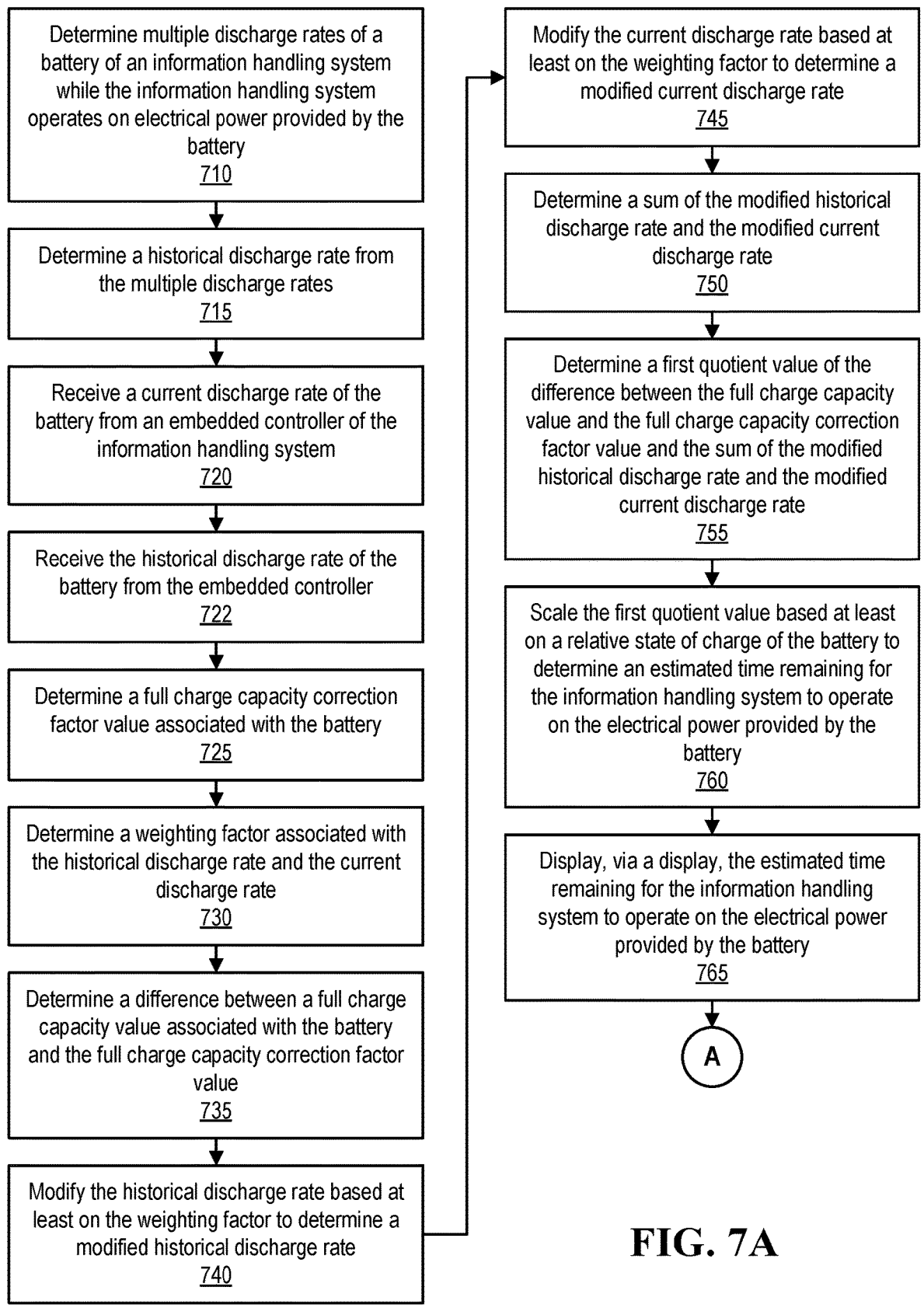
FIGS. 7A and 7B illustrate an example of a method of estimating an amount of time remaining to utilize an information handling system powered by a battery of the information handling system, according to one or more embodiments.
Figure 7B:
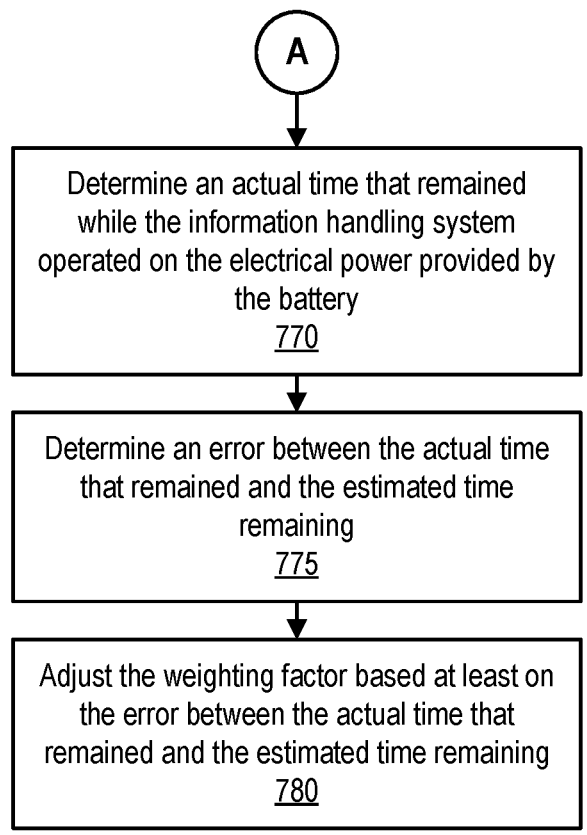

Turning now to FIGS. 7A and 7B, an example of a method of estimating an amount of time remaining to utilize an information handling system powered by a battery of the information handling system is illustrated, according to one or more embodiments. At 710, multiple discharge rates of a battery of an information handling system, while the information handling system operates on electrical power provided by the battery, may be determined. For example, EC 130 may determine multiple discharge rates of battery 145 while IHS 110 operates on electrical power provided by battery 145.

In one or more embodiments, determining multiple discharge rates of a battery of an information handling system while the information handling system operates on electrical power provided by the battery may include receiving the multiple discharge rates of the battery while the information handling system operates on electrical power provided by the battery. For example, the multiple discharge rates of the battery may be received from EC 130.

At 715, a historical discharge rate (e.g., $d_h$) may be determined from the multiple discharge rates. For example, EC 130 may determine a historical discharge rate (e.g., $d_h$) from the multiple discharge rates. In one or more embodiments, determining a historical discharge rate from the multiple discharge rates may include determining a mean discharge rate from the multiple discharge rates as the historical discharge rate.

At 720, a current discharge rate (e.g., $d_c$) of the battery may be received from an embedded controller of the information handling system. For example, one or more of EC 130, OS 162, IHSFW 172, and agent 580 may receive a current discharge rate (e.g., $d_c$) of the battery from EC 130. At 722, the historical discharge rate (e.g., $d_h$) may be received. For example, one or more of EC 130, OS 162, IHSFW 172, and agent 580 may receive the historical discharge rate (e.g., $d_h$) from EC 130.

At 725, a full charge capacity correction factor value (e.g., $C_{fcc}$) associated with the battery may be determined. For example, one or more of EC 130, OS 162, IHSFW 172, and agent 580 may determine a full charge capacity correction factor value (e.g., $C_{fcc}$) associated with battery 145. At 730, a weighting factor (e.g., $\alpha$) associated with the historical discharge rate and the current discharge rate may be determined. For example, one or more of EC 130, OS 162, IHSFW 172, and agent 580 may determine a weighting factor associated with the historical discharge rate and the current discharge rate.

At 735, a difference between a full charge capacity value (e.g., FCC) associated with the battery and the full charge capacity correction factor value (e.g., $C_{fcc}$) may be determined. For example, one or more of EC 130, OS 162, IHSFW 172, and agent 580 may determine a difference between a full charge capacity value (e.g., FCC) associated with battery 145 and the full charge capacity correction factor value (e.g., $C_{fcc}$). For instance, one or more of EC 130, OS 162, IHSFW 172, and agent 580 may determine FCC−$C_{fcc}$.

At 740, the historical discharge rate may be modified based at least on the weighting factor to determine a modified historical discharge rate. For example, one or more of EC 130, OS 162, IHSFW 172, and agent 580 may modify the historical discharge rate based at least on the weighting factor to determine a modified historical discharge rate. As an example, modifying the historical discharge rate based at least on the weighting factor to determine the modified historical discharge rate may include determining $\alpha \cdot d_h$ as the modified historical discharge rate. For instance, modifying the historical discharge rate based at least on the weighting factor to determine the modified historical discharge rate may include multiplying $d_h$ by $\alpha$ to determine the modified historical discharge rate.

At 745, the current discharge rate may be modified based at least on the weighting factor to determine a modified current discharge rate. For example, one or more of EC 130, OS 162, IHSFW 172, and agent 580 may modify the current discharge rate based at least on the weighting factor to determine a modified current discharge rate. As an example, modifying the current discharge rate based at least on the weighting factor to determine a modified current discharge rate may include determining $(1-\alpha) \cdot d_c$ as the modified current discharge rate. For instance, modifying the current discharge rate based at least on the weighting factor to determine the modified current discharge rate may include multiplying $d_c$ by $(1-\alpha)$ to determine the modified current discharge rate.

At 750, a sum of the modified historical discharge rate and the modified current discharge rate may be determined. For example, one or more of EC 130, OS 162, IHSFW 172, and agent 580 may determine a sum of the modified historical discharge rate and the modified current discharge rate. As an example, determining a sum of the modified historical discharge rate and the modified current discharge rate may include determining $\alpha \cdot d_h + (1-\alpha) \cdot d_c$.

At 755, a first quotient value of the difference between the full charge capacity value and the full charge capacity correction factor value and the sum of the modified historical discharge rate and the modified current discharge rate. For example, one or more of EC 130, OS 162, IHSFW 172, and agent 580 may determine a first quotient value of the difference between the full charge capacity value and the full charge capacity correction factor value and the sum of the modified historical discharge rate and the modified current discharge rate. As an example, determining a first quotient value of the difference between the full charge capacity value and the full charge capacity correction factor value and the sum of the modified historical discharge rate and the modified current discharge rate may include determining (FCC−$C_{fcc}$)/($\alpha \cdot d_h + (1-\alpha) \cdot d_c$).

At 760, the first quotient value may be scaled based at least on a relative state of charge (e.g., RSOC) of the battery to determine an estimated time remaining for the information handling system to operate on the electrical power provided by the battery. For example, one or more of EC 130, OS 162, IHSFW 172, and agent 580 may scale the first quotient value based at least on a relative state of charge (e.g., RSOC) of battery 145 to determine an estimated time remaining for IHS 110 to operate on the electrical power provided by battery 145. As an example, scaling the first quotient value based at least on a relative state of charge of the battery to determine an estimated time remaining for the information handling system to operate on the electrical power provided by the battery may include determining ((FCC−$C_{fcc}$)/($\alpha \cdot d_h + (1-\alpha) \cdot d_c$))·RSOC.

In one or more embodiments, a second quotient of the relative state of charge and one hundred percent may be determined. For example, (RSOC/100%) may be determined. In one or more embodiments, the first quotient and the second quotient may be utilized to determine the estimated time remaining for the information handling system to operate on the electrical power provided by the battery. For example, the first quotient may be multiplied by the second quotient to determine the estimated time remaining for the information handling system to operate on the electrical power provided by the battery. For instance, equation 550 may be utilized to determine the estimated time remaining for the information handling system to operate on the electrical power provided by the battery. As an example, one or more of EC 130, OS 162, IHSFW 172, and agent 580 may utilize equation 550 to determine the estimated time remaining for IHS 110 to operate on the electrical power provided by battery 145.

At 765, the estimated time remaining for the information handling system to operate on the electrical power provided by the battery may be displayed via a display. For example, one or more of EC 130, OS 162, IHSFW 172, and agent 580 may display, via display 182, the estimated time remaining for IHS 110 to operate on the electrical power provided by battery 145.

At 770, an actual time that remained while the information handling system operated on the electrical power provided by the battery may be determined. For example, one or more of EC 130, OS 162, IHSFW 172, and agent 580 may determine an actual time that remained while IHS 110 operated on the electrical power provided by battery 110.

At 775, an error between the actual time that remained and the estimated time remaining may be determined. For example, one or more of EC 130, OS 162, IHSFW 172, and agent 580 may determine an error between the actual time that remained and the estimated time remaining.

At 780, the weighting factor (e.g., a) may be adjusted based at least on the error between the actual time that remained and the estimated time remaining. For example, one or more of EC 130, OS 162, IHSFW 172, and agent 580 may adjust the weighting factor (e.g., a) based at least on the error between the actual time that remained and the estimated time remaining.

In one or more embodiments, the weighting factor (e.g., $\alpha$) may be adjusted based at least on other one or more criteria. For example, the weighting factor may be adjusted based at least on an identification of an application being executed by at least one processor of the information handling system. For instance, one or more of EC 130, OS 162, IHSFW 172, and agent 580 may determine an identification of the application (e.g., an APP of APPs 164-168) being executed by processor 120 of IHS 110. In one or more embodiments, the identification of the application being executed by the at least one processor may include a string of alphanumeric characters. In one example, the identification of the application being executed by the at least one processor may include a name of the application. In another example, the identification of the application being executed by the at least one processor may include a process identification of the application.

As one example, a graphics rendering application, a video rendering application, and/or a computer aided design (CAD) application, among others, may be processor-intensive. For instance, the weighting factor may be reduced. In this fashion, by reducing the weighting factor, the estimated time remaining for the information handling system to operate on the electrical power provided by the battery may be based more on the current discharge rate (e.g., $d_c$) of the battery. For instance, this may provide a better estimated time remaining for the information handling system to operate on the electrical power provided by the battery.

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with at least a portion of one or more flowcharts, at least a portion of one or more systems, at least a portion of one or more methods, and/or at least a portion of one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   at least one processor; and
   a memory medium, coupled to the at least one processor, that stores instructions executable by the at least one processor;
   an embedded controller coupled to the at least one processor; and
   a battery configured to provide electrical power to one or more components of the information handling system;
   wherein the embedded controller is configured to:
      determine a plurality of discharge rates of the battery while the information handling system operates on the electrical power provided by the battery; and
      determine a historical discharge rate from the plurality of discharge rates;
   wherein the instructions cause the information handling system to:
      receive a current discharge rate of the battery from the embedded controller;
      receive the historical discharge rate from the embedded controller;
      determine a full charge capacity correction factor value associated with the battery;
      determine a weighting factor associated with the historical discharge rate and the current discharge rate;
      determine a difference between a full charge capacity value associated with the battery and the full charge capacity correction factor value;
      modify the historical discharge rate based at least on the weighting factor to determine a modified historical discharge rate;
      modify the current discharge rate based at least on the weighting factor to determine a modified current discharge rate;
      determine a sum of the modified historical discharge rate and the modified current discharge rate;
      determine a first quotient value of the difference between the full charge capacity value and the full charge capacity correction factor value and the sum of the modified historical discharge rate and the modified current discharge rate;

scale the first quotient value based at least on a relative state of charge of the battery to determine an estimated time remaining for the information handling system to operate on the electrical power provided by the battery; and display, via a display, the estimated time remaining for the information handling system to operate on the electrical power provided by the battery.

2. The information handling system of claim 1, wherein the instructions further cause the information handling system to:

determine an actual time that remained while the information handling system operated on the electrical power provided by the battery;

determine an error between the actual time that remained and the estimated time remaining; and adjust the weighting factor based at least on the error between the actual time that remained and the estimated time remaining.

3. The information handling system of claim 1, wherein the instructions further cause the information handling system to:

determine an identification of an application being executed by the at least one processor; and adjust the weighting factor based at least on the identification of the application.

4. The information handling system of claim 1, wherein, to determine the historical discharge rate from the plurality of discharge rates, the instructions further cause the information handling system to determine a mean discharge rate from the plurality of discharge rates as the historical discharge rate.

5. The information handling system of claim 1, further comprising:

a battery charger coupled to the embedded controller;

wherein the embedded controller is further configured to:
receive an analog voltage signal from the battery charger; and
determine the current discharge rate based at least on the analog voltage signal from the battery charger.

6. The information handling system of claim 1, wherein the instructions further cause the information handling system to determine a second quotient of the relative state of charge and one hundred percent; and wherein, to scale the first quotient value based at least on the relative state of charge, the instructions further cause the information handling system to multiply the first quotient and the second quotient to determine the estimated time remaining for the information handling system to operate on the electrical power provided by the battery.

7. The information handling system of claim 1, wherein the weighting factor ranges from zero to one;

wherein, to modify the historical discharge rate based at least on the weighting factor to determine the modified historical discharge rate, the instructions further cause the information handling system to multiply the historical discharge rate by the weighting factor; and wherein, to modify the current discharge rate based at least on the weighting factor to determine the modified current discharge rate, the instructions further cause the information handling system to multiply the current discharge rate by a difference between one and the weighting factor.

8. A method, comprising:

determining, by an embedded controller of an information handling system, a plurality of discharge rates of a battery of the information handling system while the information handling system operates on electrical power provided by the battery;

determining, by the embedded controller, a historical discharge rate from the plurality of discharge rates;

receiving a current discharge rate of the battery from the embedded controller;

receiving the historical discharge rate from the embedded controller;

determining a full charge capacity correction factor value associated with the battery;

determining a weighting factor associated with the historical discharge rate and the current discharge rate;

determining a difference between a full charge capacity value associated with the battery and the full charge capacity correction factor value;

modifying the historical discharge rate based at least on the weighting factor to determine a modified historical discharge rate;

modifying the current discharge rate based at least on the weighting factor to determine a modified current discharge rate;

determining a sum of the modified historical discharge rate and the modified current discharge rate;

determining a first quotient value of the difference between the full charge capacity value and the full charge capacity correction factor value and the sum of the modified historical discharge rate and the modified current discharge rate;

scaling the first quotient value based at least on a relative state of charge of the battery to determine an estimated time remaining for the information handling system to operate on the electrical power provided by the battery; and displaying, via a display, the estimated time remaining for the information handling system to operate on the electrical power provided by the battery.

9. The method of claim 8, further comprising:

determining an actual time that remained while the information handling system operated on the electrical power provided by the battery;

determining an error between the actual time that remained and the estimated time remaining; and adjusting the weighting factor based at least on the error between the actual time that remained and the estimated time remaining.

10. The method of claim 8, further comprising:

determining an identification of an application being executed by at least one processor of the information handling system; and adjusting the weighting factor based at least on the identification of the application.

11. The method of claim 8, wherein the determining the historical discharge rate from the plurality of discharge rates include determining a mean discharge rate from the plurality of discharge rates as the historical discharge rate.

12. The method of claim 8, further comprising:

receiving, by the embedded controller, an analog voltage signal from a battery charger of the information handling system; and determining, by the embedded controller, the current discharge rate based at least on the analog voltage signal from the battery charger.

13. The method of claim 8, further comprising:

determining a second quotient of the relative state of charge and one hundred percent;

wherein the scaling the first quotient value based at least on the relative state of charge includes multiplying the first quotient and the second quotient to determine the estimated time remaining for the information handling system to operate on the electrical power provided by the battery.

14. The method of claim 8,
wherein the weighting factor ranges from zero to one;
wherein the modifying the historical discharge rate based at least on the weighting factor to determine the modified historical discharge rate includes multiplying the historical discharge rate by the weighting factor; and
wherein the modifying the current discharge rate based at least on the weighting factor to determine the modified current discharge rate includes multiplying the current discharge rate by a difference between one and the weighting factor.

15. A computer-readable non-transitory memory medium that includes instructions that, when executed by at least one processor of an information handling system, cause the information handling system to:
receive a historical discharge rate from an embedded controller of the information handling system;
receive a current discharge rate of the battery from the embedded controller;
determine a full charge capacity correction factor value associated with the battery;
determine a weighting factor associated with the historical discharge rate and the current discharge rate;
determine a difference between a full charge capacity value associated with the battery and the full charge capacity correction factor value;
modify the historical discharge rate based at least on the weighting factor to determine a modified historical discharge rate;
modify the current discharge rate based at least on the weighting factor to determine a modified current discharge rate;
determine a sum of the modified historical discharge rate and the modified current discharge rate;
determine a first quotient value of the difference between the full charge capacity value and the full charge capacity correction factor value and the sum of the modified historical discharge rate and the modified current discharge rate;
scale the first quotient value based at least on a relative state of charge of the battery to determine an estimated time remaining for the information handling system to operate on the electrical power provided by the battery; and
display, via a display, the estimated time remaining for the information handling system to operate on the electrical power provided by the battery.

16. The computer-readable non-transitory memory medium of claim 15, wherein the instructions further cause the information handling system to:
determine an actual time that remained while the information handling system operated on the electrical power provided by the battery;
determine an error between the actual time that remained and the estimated time remaining; and
adjust the weighting factor based at least on the error between the actual time that remained and the estimated time remaining.

17. The computer-readable non-transitory memory medium of claim 15, wherein the instructions further cause the information handling system to:
determine an identification of an application being executed by at least one processor of the information handling system; and
adjust the weighting factor based at least on the identification of the application.

18. The computer-readable non-transitory memory medium of claim 15, wherein, to determine the historical discharge rate from the plurality of discharge rates, the instructions further cause the information handling system to determine a mean discharge rate from the plurality of discharge rates as the historical discharge rate.

19. The computer-readable non-transitory memory medium of claim 15,
wherein the instructions further cause the information handling system to determine a second quotient of the relative state of charge and one hundred percent; and
wherein, to scale the first quotient value based at least on the relative state of charge, the instructions further cause the information handling system to multiply the first quotient and the second quotient to determine the estimated time remaining for the information handling system to operate on the electrical power provided by the battery.

20. The computer-readable non-transitory memory medium of claim 15,
wherein the weighting factor ranges from zero to one;
wherein, to modify the historical discharge rate based at least on the weighting factor to determine the modified historical discharge rate, the instructions further cause the information handling system to multiply the historical discharge rate by the weighting factor; and
wherein, to modify the current discharge rate based at least on the weighting factor to determine the modified current discharge rate, the instructions further cause the information handling system to multiply the current discharge rate by a difference between one and the weighting factor.

* * * * *